(12) United States Patent
Schuele et al.

(10) Patent No.: US 11,251,166 B2
(45) Date of Patent: Feb. 15, 2022

(54) FLUIDIC ASSEMBLY EMISSIVE DISPLAY USING AXIAL LIGHT EMITTING DIODES (LEDS)

(71) Applicant: eLux Inc., Vancouver, WA (US)

(72) Inventors: Paul J. Schuele, Washougal, WA (US); Kenji Sasaki, West Linn, OR (US); Kurt Ulmer, Vancouver, WA (US); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 144 days.

(21) Appl. No.: 16/846,493

(22) Filed: Apr. 13, 2020

(65) Prior Publication Data

US 2020/0251451 A1   Aug. 6, 2020

Related U.S. Application Data

(63) Continuation-in-part of application No. 16/727,186, filed on Dec. 26, 2019, now Pat. No. 11,145,787,
(Continued)

(51) Int. Cl.
*H01L 25/075* (2006.01)
*H01L 33/38* (2010.01)
*H01L 33/48* (2010.01)

(52) U.S. Cl.
CPC ......... *H01L 25/0753* (2013.01); *H01L 33/38* (2013.01); *H01L 33/486* (2013.01);
(Continued)

(58) Field of Classification Search
CPC ... H01L 25/0753; H01L 33/38; H01L 33/486; H01L 2933/0033; H01L 2933/0066; H01L 2933/0016
See application file for complete search history.

(56) References Cited

U.S. PATENT DOCUMENTS 5,780,867 A * 7/1998 Fritz ................. H01L 33/06
257/13
6,300,149 B1 * 10/2001 Smith ................. H01L 24/95
257/E21.705
(Continued)

FOREIGN PATENT DOCUMENTS

CN 104157767 A * 11/2014
KR 20140060027 A * 5/2014

*Primary Examiner* — Sitaramarao S Yechuri
(74) *Attorney, Agent, or Firm* — Law Office of Gerald Maliszewski; Gerald Maliszewski

(57) ABSTRACT

A fluidic assembly emissive display panel is presented with a plurality of wells exposing LED interfaces. Each LED interface is made up of a planar first interconnect platform having an x-axis first depth and is configured to accept an axial LED first electrode mounting wing. A planar second interconnect platform has the first depth and is configured to accept an axial LED second electrode mounting wing. A groove is interposed between the first and second interconnect platforms and has an x-axis second depth, greater than the first depth, and is configured to accept an axial LED body locking tooth. The axial LEDs have an inorganic LED body with two symmetrical locking teeth. First and second electrode mounting wings are electrically connected to corresponding LED interface first and second interconnect platforms, and aligned in a plane orthogonal to stacked LED body semiconductor layers.

40 Claims, 18 Drawing Sheets

Related U.S. Application Data which is a continuation of application No. 16/406,196, filed on May 8, 2019, now Pat. No. 10,643,981, which is a continuation-in-part of application No. 16/406,080, filed on May 8, 2019, now Pat. No. 10,804,426, which is a continuation-in-part of application No. 16/125,671, filed on Sep. 8, 2018, now Pat. No. 10,516,084, which is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(52) U.S. Cl.
CPC ............ *H01L 2933/0033* (2013.01); *H01L 2933/0066* (2013.01)

(56) References Cited

U.S. PATENT DOCUMENTS

| | | | | |
|---|---|---|---|---|
| 8,390,537 | B2* | 3/2013 | Hillis | H01L 24/95 345/55 |
| 9,911,764 | B2* | 3/2018 | Bae | H01L 33/62 |
| 2005/0009303 | A1* | 1/2005 | Schatz | H01L 24/95 438/466 |
| 2008/0093607 | A1* | 4/2008 | Feng | H01L 33/483 257/82 |
| 2008/0135956 | A1* | 6/2008 | Huber | H01F 1/26 257/421 |
| 2010/0060553 | A1* | 3/2010 | Zimmerman | H01L 25/0753 345/60 |
| 2010/0075463 | A1* | 3/2010 | Smith | H01L 25/50 438/118 |
| 2011/0225816 | A1* | 9/2011 | Chou | H05K 1/186 29/829 |
| 2013/0214302 | A1* | 8/2013 | Yeh | H01L 24/95 257/88 |
| 2013/0313591 | A1* | 11/2013 | Shimada | H01L 23/3171 257/98 |

* cited by examiner

LED = 19.6 μm
cell = 31.2 μm

LED = 19.7 μm
cell = 32.9 μm

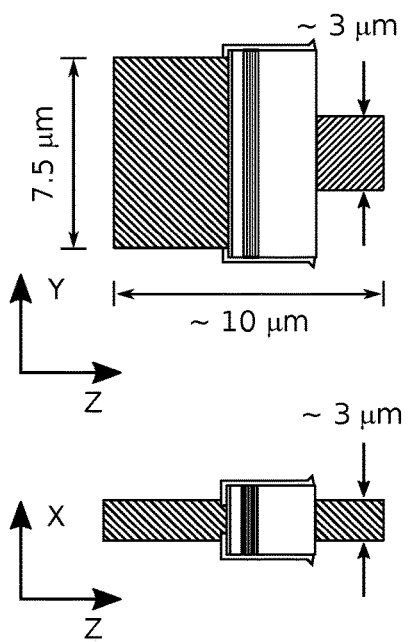
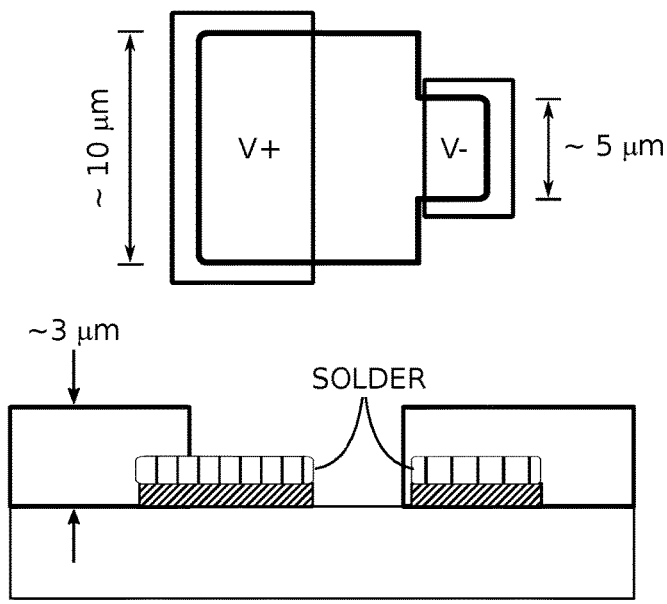
Fig. 17A
Fig. 17B
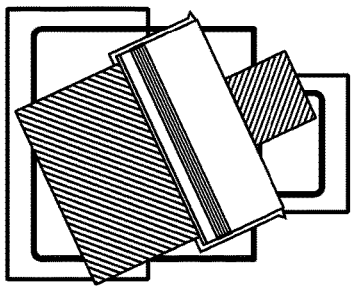
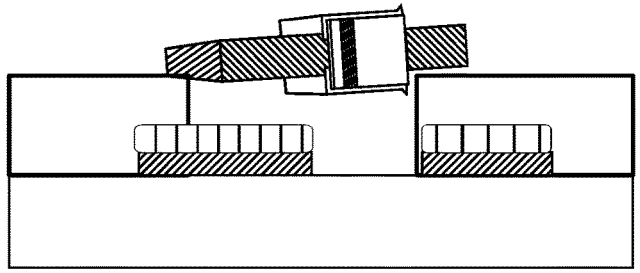
Fig. 18A
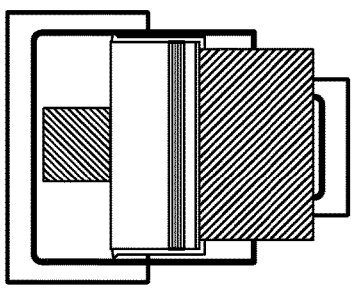
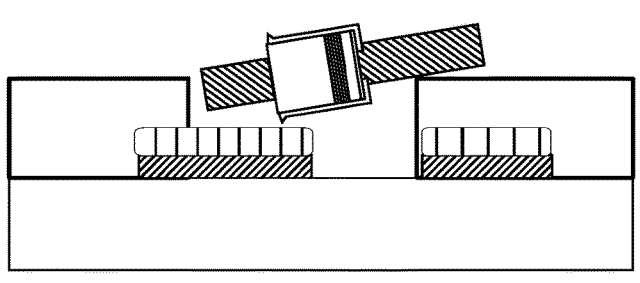
Fig. 18B

FLUIDIC ASSEMBLY EMISSIVE DISPLAY USING AXIAL LIGHT EMITTING DIODES (LEDS)

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to display technology and, more particularly, to inorganic axial micro-light emitting diodes (μLEDs) designed for use with fluidic assembly emissive displays.

2. Description of the Related Art

A red/green/blue (RGB) display is composed of pixels that emit light at three wavelengths corresponding to the visible colors red, green, and blue. The RGB components of the pixel, each of which is referred to as a sub-pixel, are energized in a systematic way to additively produce the colors of the visible spectrum. There are several display types that produce the RGB images in different ways. Liquid crystal displays (LCD) are the most prevalent technology and they produce RGB images by shining a white light source, typically a phosphor produced white LED, through a color filter of a subpixel. Some portion of the white light wavelengths is absorbed and some transmitted through the color filter. As a consequence, the efficiency of an LCD display may be less than 4% and the contrast ratio is limited by the leakage of light through the cell. Organic light emitting diode (OLED) displays produce RGB light by direct emission of each of those wavelengths of light at a pixel level within the organic light emitting material. The OLED materials are direct emitting so the display contrast ratio is high, but the organic materials can be subject to long term degradation, which causes image burn-in.

A third display technology and the one addressed herein is the micro-LED display, which uses micro-sized (5 to 150 μm diameter) inorganic LEDs for direct emission of light at the subpixel level. Inorganic micro-LED displays have a number of advantages over competing displays. When compared with LCD displays, the micro-LED display has very high contrast of over 50,000:1 and higher efficiency. Unlike the OLED display, inorganic LEDs do not suffer burn-in effects and the achievable brightness is significantly higher.

The current mainstream television with HDTV resolution has 6 million pixels, and the higher resolution 4K and 8K standards have 25 and 99 million pixels respectively. Even the relatively small displays used in tablets and cell phones have millions of pixels with display resolutions over 600 pixels per inch (ppi). Consequently, the manufacture of micro-LED based displays requires the low cost assembly of large area arrays of micro-LEDs at different pixel pitches to make a wide range of display sizes and resolutions. The most conventional technique for assembling micro-LED arrays is referred to as pick-and-place because each micro-LED is individually removed from a carrier and positioned on a substrate as described below. Because each micro-LED is handled separately the assembly process is painfully slow.

FIGS. 1A through 1C depict initial steps in the fabrication of inorganic micro-LEDs (prior art). The wide-spread adoption of gallium nitride (GaN) based high brightness inorganic LEDs for general lighting has created a sophisticated manufacturing system, so the micro-LEDs used for display can be based on the investments made in that industry. GaN based LEDs that emit in the blue wavelength (around 440 nanometers (nm)) are fabricated in a complex series of high temperature metalorganic chemical vapor deposition (MOCVD) steps to produce the vertical LED structure shown in cross section in FIG. 1A. Fabrication takes place on a polished sapphire, silicon (Si), or Si carbide (SiC) substrate 50 to 200 mm in diameter. The surface is prepared by depositing an optional aluminum nitride (AlN) buffer layer plus undoped GaN to produce a crystalline surface with low defects and the lattice constant of GaN. The thickness and temperature of this initial deposition is tuned to compensate for the lattice mismatch between the substrate and GaN, with increasing thickness improving surface quality, so high efficiency devices are over about 3 μm thick. Because the MOCVD deposition process is complex and expensive, it is important that the micro-LED process is optimized to most effectively use the full area of the growth wafer.

After the initial growth to prepare a crystalline GaN surface, the first LED layer is grown with Si doping added to produce n+ GaN for the cathode. Optionally, the stack can include layers tuned for electron injection and hole blocking. Next, the multiple quantum well (MQW) structure is deposited with alternating layers of $In_xGa_{1-x}N$ and GaN, where the indium content and the thickness of the layers determines the emission wavelength of the device. Increasing indium content moves the emission peak to longer wavelengths but also increases the stress due to lattice mismatch, so high-efficiency GaN devices cannot be made for red emission, and the efficiency of green emitting devices is lower than that of blue LEDs. After the MQW, the stack can include layers tuned for electron blocking and hole injection (not shown). The MOCVD layer sequence is completed by depositing Mg-doped GaN to form the p+ anode layer.

LEDs used for general lighting are much larger than those used for micro-LED displays (up to 3-4 millimeters (mm) per side versus 5 to 100 microns (μm) in diameter), so the patterning and electrode requirements are significantly different. The micro-LED is bonded to the substrate electrodes using either a solder material or an asymmetric conductive film (ACF). In contrast, large general lighting LEDs are often connected by wire bonding or solder paste on a lead frame. Because the micro-LEDs are quite small, more of the area of the MOCVD wafer is removed in the patterning process, decreasing the available emission area from each wafer. LED wafers are relatively expensive and the high-resolution processing for micro-LED fabrication further increases cost, so it is very important to use the emission area as efficiently as possible to minimize the cost of materials for a micro-LED display.

In the simplest process flow, a transparent conductive electrode is formed over the MOCVD stack by depositing a thin layer (a few nm) of nickel oxide ($NiO_x$) to match the p+ GaN work function, followed by a layer of indium tin oxide (ITO) that may be 50 to 300 nm thick. The completed stack is then patterned and etched, typically using a chlorine ($Cl_2$) based reactive ion etch (RIE) process, to produce individual micro-LEDs. FIG. 1B shows a top down plan view of a closely packed array of circular micro-LEDs 5 μm in diameter on a 6 μm pitch. This is about the smallest practical size and separation for a circular micro-LED. In particular, the LED structure may be 3 to 5 µm thick to produce a high efficiency micro-LED, so the thickness of the structure imposes a limit on the minimum space that can be successfully etched. In the example shown with 5 µm devices and 1 µm spaces, the usable LED area is about 63% of a 100 mm wafer and there are about 200 million micro-LEDs per wafer, or enough to make two 8K televisions.

After the LED outline is etched, additional processing is carried out to form an electrode on the anode as shown schematically in FIG. 1C. A passivation layer, typically of plasma-enhanced chemical vapor deposition (PECVD) silicon dioxide ($SiO_2$) or atomic layer deposition (ALD) aluminum oxide ($Al_2O_3$) is deposited to prevent leakage current, and a contact opening to the ITO layer is etched. The structure is completed by depositing an electrode stack including a solder material such as an alloy of indium/tin (In/Sn) or gold/germanium (Au/Ge).

FIGS. 2A through 2C depict subsequent steps in the fabrication of inorganic micro-LEDs (prior art). The completed micro-LEDs are bonded to a carrier wafer with an adhesive layer and removed from the sapphire growth substrate by laser lift off as shown schematically in FIG. 2A. Then individual micro-LEDs can be removed from the carrier by a pickup head and positioned on each sub-pixel where the anode electrode is bonded to form an electrical connection to a suitable electrode on the substrate as in FIG. 2B. The pixel is completed by coating the micro-LED with a suitable dielectric such as a photo patternable polyimide, and connections to the micro LED cathode and a substrate electrode are opened. Metal interconnect is deposited and patterned to make the connection as shown in FIG. 2C.

The pick-and-place assembly presented here has several important weaknesses that lead to high cost and lower yield. The assembly process is inherently serial, so assembling millions of micro-LEDs takes a long time and is expensive. The very small size of the micro-LED makes construction of a pickup head quite difficult and it is possible that the edges of the mechanism will interfere with adjacent micro-LEDs in pickup or the reflector structure on assembly. The simple pick-and-place method shown can be expanded to a parallel process by using a mass transfer head that captures and transfers many micro-LEDs at the same time. The mass transfer methods can have poor yield if there are defective micro-LEDs in the group being transferred, and the pitch of the micro-LEDs is determined by the spacing of devices on the growth wafer.

FIGS. 3A and 3B are, respectively, partial cross-sectional and planar views of a surface mount (SM) micro-LED. Fluidic assembly techniques presented U.S. Pat. Nos. 9,825, 202, 10,418,527, and 10,543,486, which are incorporated herein by reference, are effective for the low cost manufacture of relatively low-resolution large displays, such as those used in public information displays for example. The surface mount micro-LEDs described in pending application Ser. No. 16/406,080, which is also incorporated herein by reference, present a range of solutions within the constraints on fluidic assembly by using different mesa areas to adjust the emission area of the micro-LED while maintaining the outer diameter of a disk suitable for the circular trap structures (wells), shown for example in Ser. No. 16/406,080 FIGS. 8A and 8B. The architecture of the circular surface mount micro-LED shown herein in FIGS. 3A and 3B can be made with 1 µm design rules using a stepper for photolithography and the resulting micro-LED can be scaled down to a minimum diameter of about 17 µm as shown. In this case, with a 17 µm diameter micro-LED and 2 µm space, the emission area utilized by micro-LEDs is about 50% of the MOCVD wafer. The result is about 20 million micro-LEDs harvested from a 100 mm wafer, so the materials cost for this micro-LED design is about 10 times that of the 5 µm diameter micro-LED described above. Also, because the SM micro-LED is larger, the minimum pixel size is about 75λ75 µm. Thus, the highest resolution display that can be achieved is about 340 ppi, which is too low for tablet or cell phone displays. This micro-LED architecture is too large and too expensive to compete in the television and personal device markets.

It would be advantageous if a micro-LED existed with the advantages of surface mount electrodes for massively parallel fluidic assembly, with an area equivalent to the simple 5 µm diameter micro-LED, so as to minimize cost and maximize display resolution.

SUMMARY OF THE INVENTION

Axial micro light emitting diode (LED) devices and associated display panels are presented herein. These devices are an important extension of the fluidic assembly technology to make surface mount micro-LED structures that can be used for high-resolution red-green-blue (RGB) displays of up to 800 pixels per inch (ppi). The axial micro-LED may be based on conventional gallium nitride (GaN) metalorganic chemical vapor deposition (MOCVD) wafers such as those used for general lighting, but the structure is extended vertically to make surface mount electrodes with a maximally efficient emission area. The shape of the axial micro-LED device and the trap structure (well) on the display substrate are chosen so that the fluidic assembly process positions the micro-LED with the orientation of the cathode and anode connected to negative and positive voltage sources, respectively, of the supporting display panel.

Accordingly, a fluidic assembly emissive display panel is presented including a support substrate with a top surface and a light emitting diode (LED) cross-point control matrix comprising an array of column and row conductive lines. An insulating layer with a yz-axis planar top surface overlies the support substrate top surface and a plurality of wells (LED trapping structures) are formed in the insulating layer, exposing LED interfaces in the support substrate top surface. The wells may typically have a circular or rectangular shape, although more complicated key shapes may also be used for differentiating between LED shapes. Each LED interface is made up of a planar first interconnect platform having an x-axis first depth with respect to the insulating layer top surface, attached to a corresponding column line. The first interconnect platform is configured to accept an axial LED first electrode mounting wing. Likewise, a planar second interconnect platform has the first depth, is attached to a corresponding row line, and is configured to accept an axial LED second electrode mounting wing. A groove is interposed between the first and second interconnect platforms and has an x-axis second depth, greater than the first depth. The groove is configured to accept an axial LED body locking tooth.

In one aspect, rectangular first and second interconnect platforms have different z-axis extensions and a common y-axis length, making the groove z-axis extension offset from a center y-axis, but (optionally) with the same y-axis length as the interconnect platforms. In a different aspect, the first and second interconnect platforms have different y-axis length bisected by the center z-axis.

In the case of an RGB display for example, the display panel is made up of a plurality of pixel groups, with each pixel group including 11 number (e.g., 3) of LED interfaces, which may be differentiated by characteristics such as well shape, first interconnect platform shape, second interconnect platform shape, groove shape, or combinations thereof. In this case, the axial LEDs have mutually distinguishing characteristics matching the corresponding well shapes.

The wells are occupied by axial LEDs having an inorganic LED body with two symmetrical locking teeth, with one of the locking teeth lodged in the LED interface groove. The axial LEDs are typically gallium nitride (GaN) or aluminum gallium indium phosphide (AlGaInP). A first electrode mounting wing is electrically connected between a first doped polarity (e.g., n+) semiconductor layer of the LED body and the LED interface first interconnect platform, and is aligned in a plane orthogonal to stacked LED body semiconductor layers. Likewise, a second electrode mounting wing is electrically connected between a second doped polarity (e.g., p+) semiconductor layer of the LED body, opposite in polarity to the first doped polarity, and the LED interface second interconnect platform, and is also aligned orthogonal to the stacked semiconductor layers.

To form the locking teeth, the LED body has an x-axis width orthogonal to the stacked semiconductor layers, and the first and second electrode mounting wings bisect the LED body width. More explicitly, the first and second electrode mounting wings have x-axis widths less than the LED body width, forming the symmetrical LED body locking teeth extending beyond the x-axis widths of the first and second electrode mounting wings. In one aspect, the z-axis extension of the first and second electrode mounting wings may differ, as an added keying mechanism. Likewise, the y-axis lengths of the first and second electrode mounting wings may differ in another aspect. In a different aspect, a distributed Bragg reflector (DBR) coating may be formed on the LED body locking tooth lodged in the LED interface groove.

Also presented is a method for the fluidic assembly of emissive display panels. The method provides a panel with a plurality of wells exposing LED interfaces, as explained above. The method also provides axial LEDs, as explained above. The method adds the LEDs to a liquid (fluid) to create a suspension of LEDs, and flows the suspension across the panel. In the case of a panel using circular wells, a 2-step process first captures randomly aligned LEDs within the diameter of the wells. Captured LEDs are subsequently rotated within the well diameters in response to the fluid flow. In response to rotating the captured LEDs, the LED locking teeth become lodged in corresponding LED interface grooves. Typically, the LED interconnect platforms are solder-coated, and the method then anneals the panel to electrically connect the LED electrode wings to the LED interface interconnect platforms. In one aspect, the LEDs have a DBR coating, and subsequent to lodging LED locking teeth in corresponding LED interface grooves, the method anisotropically etches the LEDs to remove exposed DBR.

In the case of an RGB panel with pixel groups, where each pixel group includes n number of LED interface surfaces, the LED interfaces in each pixel group may be distinguished by a characteristic such as well diameter, first interconnect platform shape, second interconnect platform shape, groove shape, or combinations thereof. Likewise, n types of LEDs may be provided that are mutually distinguished by a characteristic such as LED body height, LED body length, electrode wing extension, electrode wing length, or combinations thereof. Then, the step of flowing the suspension includes flowing a suspension including a combination of all n types of LEDs, or sequentially flowing n suspensions with the corresponding different types of LEDs.

Additional details of the above-described axial LED and display panel, as well as associated fabrication methods, are provided below.

BRIEF DESCRIPTION OF THE DRAWINGS

FIGS. 17A and 17B depict alternative axial LED and substrate well keying features based upon the use of different length LED electrode mounting wings.

FIGS. 18A through 18C are plan and partial cross-sectional views respectively depicting the axial LED of FIG. 17A in random, reversed, and correct orientation for substrate bonding.

DETAILED DESCRIPTION

Figure 4A:
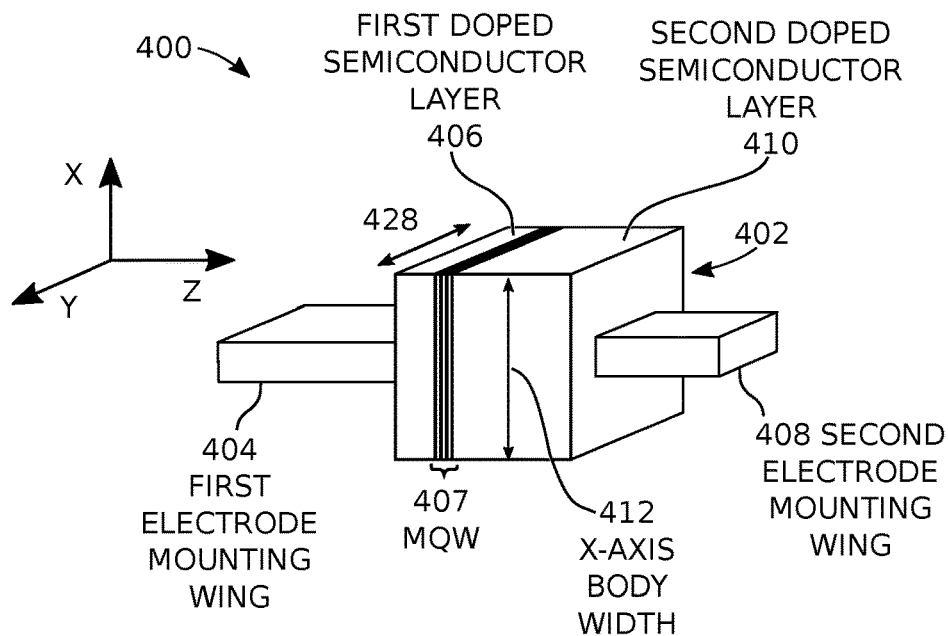
FIGS. 4A through 4C are, respectively, perspective, plan, and partial cross-sectional views of an axial light emitting diode (LED).
Figure 4B:
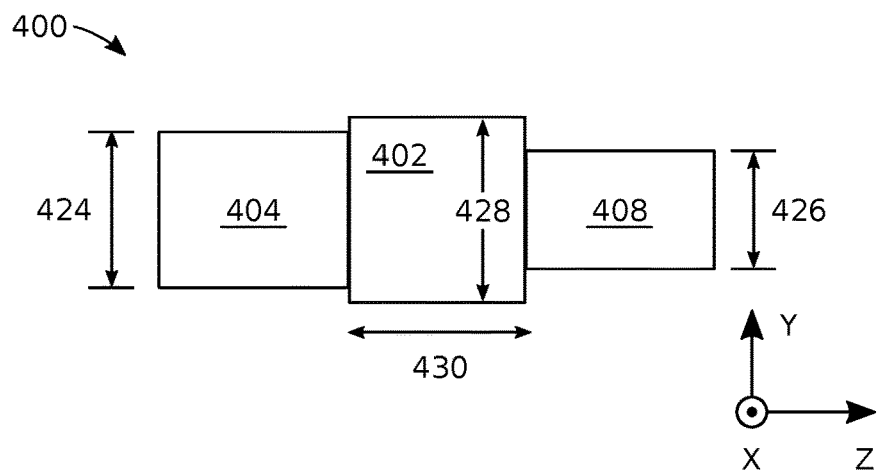
Figure 4C:
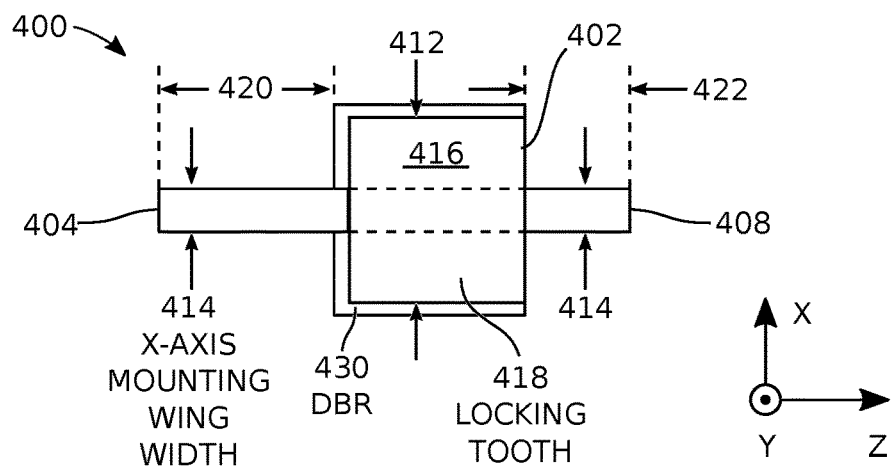

FIGS. 4A through 4C are, respectively, perspective, plan, and partial cross-sectional views of an axial light emitting diode (LED). The axial LED 400 comprises an inorganic LED three-dimensional body 402 comprising stacked semiconductor horizontal layers (406, 407, and 410) in parallel xy-axes planes. The axial LED 400 may also be referred to as a radial, blade, or spindle LED. A first electrode mounting wing 404 is operatively connected to a first doped polarity (e.g., p+) semiconductor layer 406 of the LED body 402 and aligned in a zy-axes plane orthogonal to the xy-axes planes. A second electrode mounting wing 408 is operatively connected to a second doped polarity (e.g., n+) semiconductor layer 410 of the LED body 402, opposite in polarity to the first doped polarity, and aligned in the same zy-axis plane as the first electrode mounting wing 404. As used herein, "operatively connected" is defined to mean directly connected or connected through intervening elements. For example, the LED 400 may be a gallium nitride (GaN) LED with the LED body 402 comprising an n-doped GaN (n-GaN) semiconductor layer 410, a multiple quantum well (MQW) layer 407 overlying the n-GaN layer, and a p-doped GaN (p-GaN) layer 406 overlying the MQW layer. In another example, the LED 400 is an aluminum gallium indium phosphide (AlGaInP) LED with the LED body 402 comprising an n-doped GaInP (n-GaInP) semiconductor layer 410, a MQW layer 407 overlying the n-GaInP layer, and a p-doped AlGaInP (p-AlGaInP) layer 406 overlying the MQW layer. However, the LED is not necessarily limited to these explicit semiconductor materials. In the interest of simplicity, the conventional insulating, barrier, and current spreading layers that might be used are omitted from these drawings, but rather, are presented in detail below, as well as in the Background Section above.

The LED body 402 has an x-axis width 412 and the zy-axes plane of the first and second electrode mounting wings 404 and 408 bisects the LED body width. Further, the first and second electrode mounting wings 404 and 408 have x-axis widths 414 less than the LED body width 412, forming symmetrical LED body locking teeth 416 and 418, defined by the dotting lines shown in FIG. 4C, extending beyond the x-axis widths of the first and second electrode mounting wings. In one aspect, as shown in FIG. 4C, the first electrode mounting wing 404 has a z-axis first extension 420 and the second electrode mounting wing has a z-axis second extension 422, less than the first extension. In other aspects, as shown if FIG. 4B, the wing extensions may be equal.

In another aspect, as shown in FIG. 4B, the first electrode mounting wing 404 has a y-axis first length 424 and the second electrode mounting wing 408 has a y-axis second length 426, less than the first length. In other aspects, as shown in FIG. 4A, the wing lengths may be equal.

In one aspect, the LED body has a y-axis length 428 greater than or equal to the LED body width 412. Further, the LED body may have a z-axis height 430 greater than or equal to the LED body width 412. In yet another aspect, a distributed Bragg reflector (DBR) layer coating 430 overlies the LED body 412.

Figure 5A:
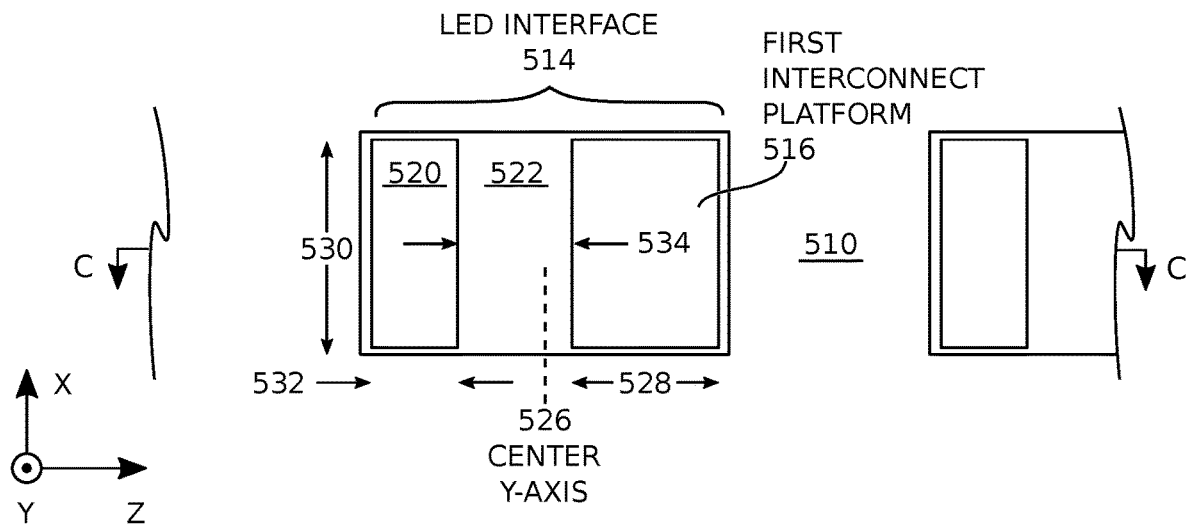
FIGS. 5A through 5D are, respectively, two plan and two partial cross-sectional views of a fluidic assembly emissive display panel.
Figure 5B:
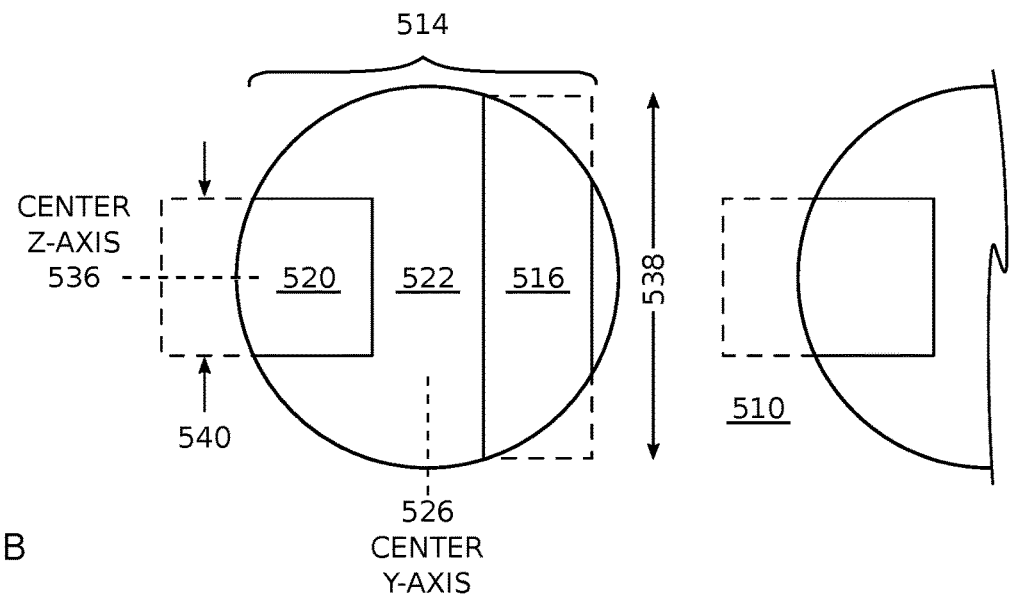
Figure 5C:
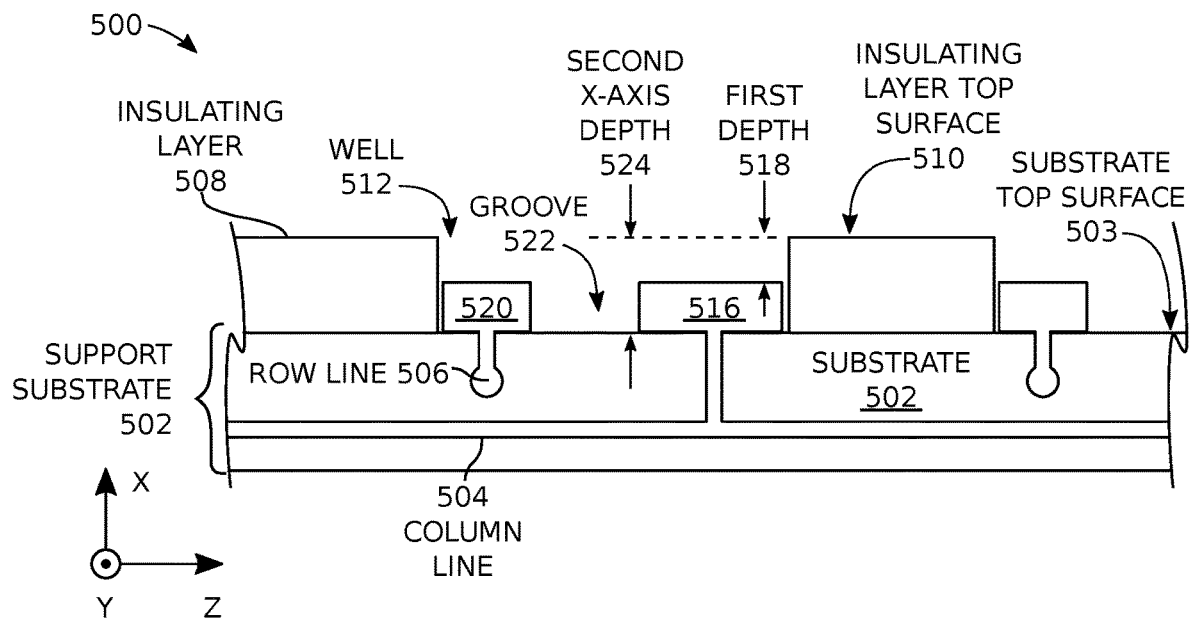

FIGS. 5A through 5D are, respectively, two plan and two partial cross-sectional views of a fluidic assembly emissive display panel. The display panel 500 comprises a support substrate 502 with a top surface 503 and a light emitting diode (LED) cross-point control matrix comprising an array of column and row conductive lines, respectively represented as 504 and 506. An insulating layer 508 with a yz-axis planar top surface 510 overlies the support substrate top surface 503. A plurality of wells 512 are formed in the insulating layer 508, exposing LED interfaces 514 in the support substrate top surface 503. As would be understood in the art, a display is typically comprised of millions of LEDs, and therefore millions of LED interfaces. In the interest of simplicity, only one well 512 and LED interface 514 are shown. The wells may have a circular shape as shown in FIG. 5B or a rectangular shape as shown in FIG. 5A.

The LED interface 514 comprises a planar first interconnect platform 516 having an x-axis first depth 518 with respect to the insulating layer top surface 514. The first interconnect platform 516 is connected to a corresponding column line 504, and configured to accept an axial LED first electrode mounting wing. A planar second interconnect platform 520 has the first depth 518, is connected to a corresponding row line 506, and is configured to accept an axial LED second electrode mounting wing. A groove 522 interposed between the first and second interconnect platforms 516 and 520 has an x-axis second depth 524, greater than the first depth 518, and is configured to accept an axial LED body locking tooth. Typically, the first and second interconnect platforms 516 and 520 have a rectangular shape, and the groove 522 has a rectangular shape.

As shown in FIG. 5A, an LED interface 514 may be bisected by a center y-axis 526. The first interconnect platform 516 has a z-axis first extension 528 and a y-axis first length 530. The second interconnect platform has a z-axis second extension 532, less than the first extension, and the y-axis first length 530. As a result, the groove 522 has a z-axis third extension 534, offset from the center y-axis 526, and the y-axis first length 530. Alternatively stated, a greater surface area of the groove is located between the center y-axis 526 and the second interconnect platform 520. Alternatively as seen in FIG. 5B, the interconnect extensions in the z-axis may be equal.

In another aspect shown in FIG. 5B, an LED interface 514 may be bisected by a center z-axis 536. The first interconnect platform 516 has a y-axis first length 538 bisected by the center z-axis 536. The second interconnect platform 520 has a y-axis second length 540 bisected by the center z-axis 536, less than the first length 538. In this example, the center y-axis 526 bisects equal groove surface areas.

As noted above, every LED display panel typically comprises millions of LEDs. In the case of a red-green-blue (RGB) display, there would be millions of pixel groups, with each pixel group comprising n number of LED interfaces. For example, n may be equal to 3, with one LED interface for each color. To support fluidic assembly, as explained in greater detail below, the LED interfaces in each pixel group are mutually distinguished by a characteristic such as well shape (e.g., circular or rectangular), first interconnect platform shape (y-axis length or z-axis extension), second interconnect platform shape, groove shape (y-axis length, z-axis extension, or y-axis offset), or combinations thereof.

Figure 5D:
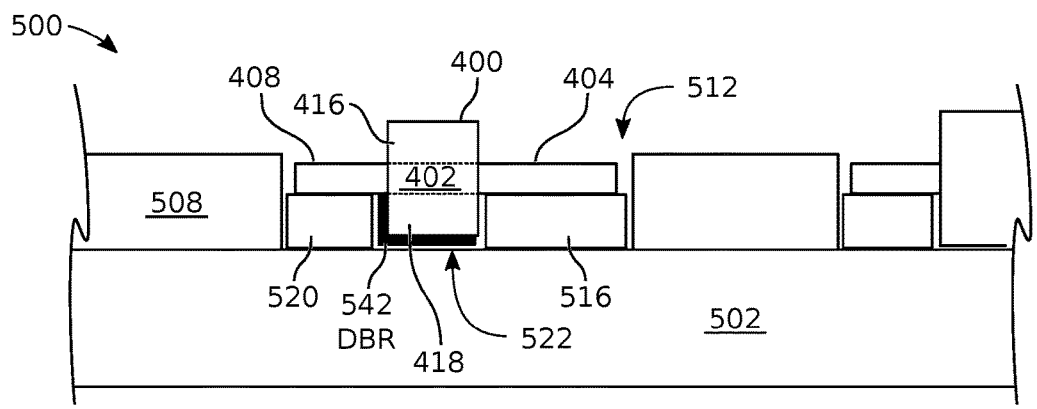

As seen in FIG. 5D, axial LEDs 400 occupy the well 512. Each axial LED 400 comprises an inorganic LED body 402 with two symmetrical locking teeth 416 and 418, with one of the locking teeth lodged in the LED interface groove 522. Note, although locking tooth 418 is shown lodged in groove 522, it could alternatively be locking tooth 416, as the capture of the LEDs is random. The use of fluidic deposition to capture LEDs is explained in greater detail below. A first electrode mounting wing 404 is electrically connected between a first doped polarity semiconductor layer of the LED body 402 and the LED interface first interconnect platform 516. As seen in FIG. 4A, the first electrode mounting wing is aligned in a plane orthogonal to stacked LED body semiconductor layers. A second electrode mounting wing 408 is electrically connected between a second doped polarity semiconductor layer of the LED body 402, opposite in polarity to the first doped polarity, and the LED interface second interconnect platform 520. The second electrode mounting wing 408 is aligned orthogonal to the stacked semiconductor layers. Additional details of the axial LEDs are provided in the explanation of FIGS. 4A-4C, and are not repeated here in the interest of brevity. In one aspect as shown in FIG. 5D, a distributed Bragg reflector (DBR) coating 542 is formed on the LED body locking tooth (416 or 418) lodged in the LED interface groove 522. Although the emissive elements have been described herein as LEDs, alternatively they may be any electrical component capable of emitting light.

The general process for making a micro-LED display using inorganic LEDs and fluidic assembly on a display backplane has been reported in U.S. Pat. Nos. 9,825,202 and 10,418,527, which are incorporated herein by reference. In particular, the process flow for making a suitable display backplane is described in U.S. Pat. No. 9,825,202 starting at Col. 13 ln. 26 and shown in FIG. 17. Electrical requirements are described in pending application Ser. No. 16/727,186, which is also incorporated herein by reference. The display panels described above have the same row and column arrangement and thin-film transistor (TFT) circuits as previously described, except that the feature sizes are smaller and the details of the fluidic assembly trap structures are changed to match the axial micro-LED structure. The geometric requirements for fluidic assembly are presented in U.S. Pat. No. 9,825,202 starting at Col. 12 ln. 56 and FIG. 16. The devices described herein are an important extension of the fluidic assembly technology to make surface mount micro-LED structures that can be used for micro-LED displays with resolutions as high as 800 pixels per inch (ppi).

Figure 6A:
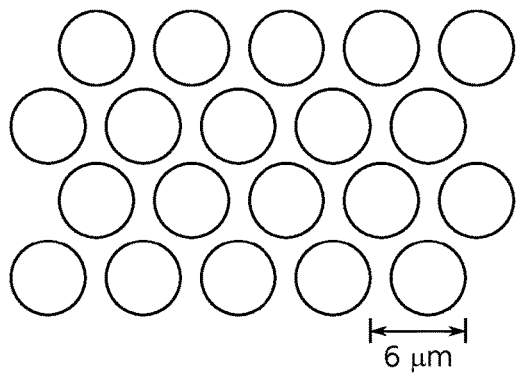
FIGS. 6A (prior art) and 6B are plan drawings contrasting prior art inorganic micro-LEDs with axial micro-LEDs.
Figure 6B:
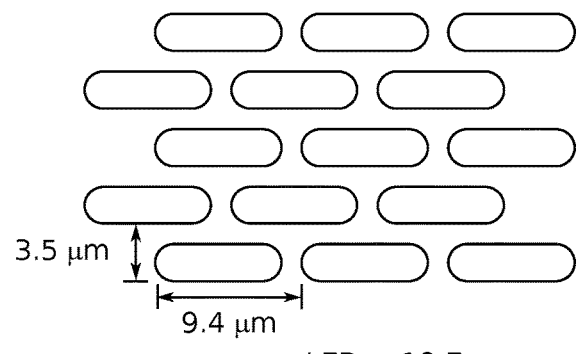

FIGS. 6A (prior art) and 6B are plan drawings contrasting prior art inorganic micro-LEDs with axial micro-LEDs. Based on the idea that a cost effective television display requires that each metalorganic chemical vapor deposition (MOCVD) wafer must produce a maximum number of micro-LEDs to minimize the materials cost, it can be argued that the smallest practical micro-LED is a close packed circular structure 5 µm in diameter on 6 µm pitch as shown in FIG. 6A. This structure uses 1 µm design rules and is reasonably practical as described above. The axial micro-LED matches the utilization and LED emission area (119.7 µm$^2$) of this structure by making exemplary extended structures 8.4×2.5 microns (µm) as shown in FIG. 6B.

FIGS. 7A through 7E depict steps in the fabrication of an exemplary axial GaN micro(µ)-LED.

Figure 1A:
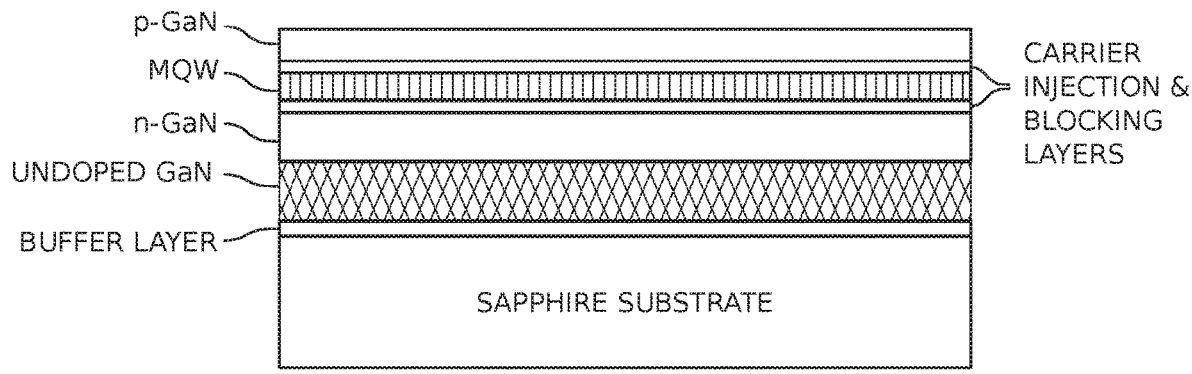
FIGS. 1A through 1C depict initial steps in the fabrication of inorganic micro-LEDs (prior art).
Figure 1B:
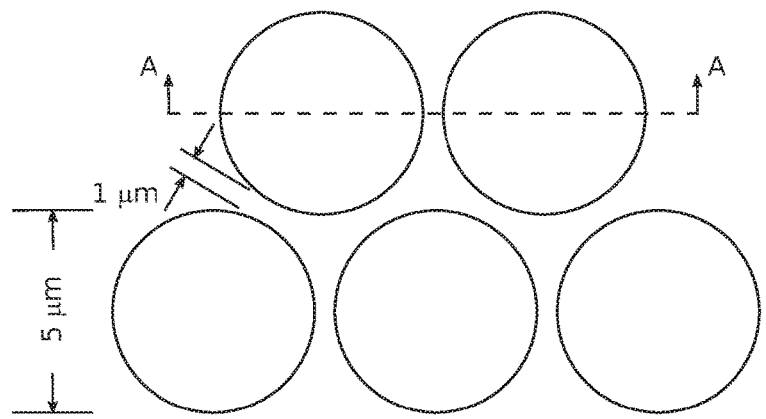
Figure 1C:
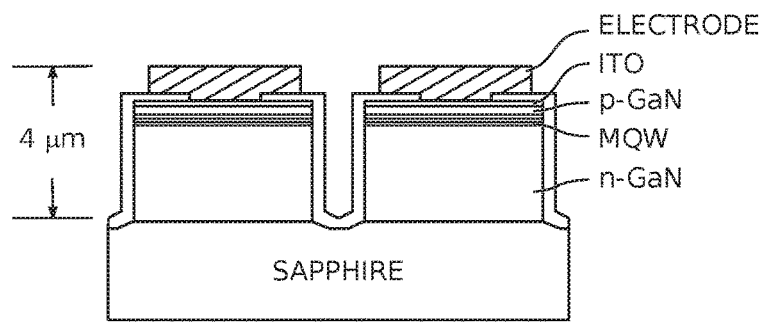
Figure 2A:
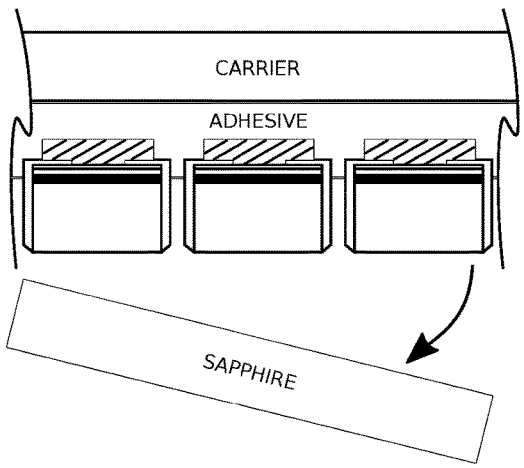
FIGS. 2A through 2C depict subsequent steps in the fabrication of inorganic micro-LEDs (prior art).
Figure 2B:
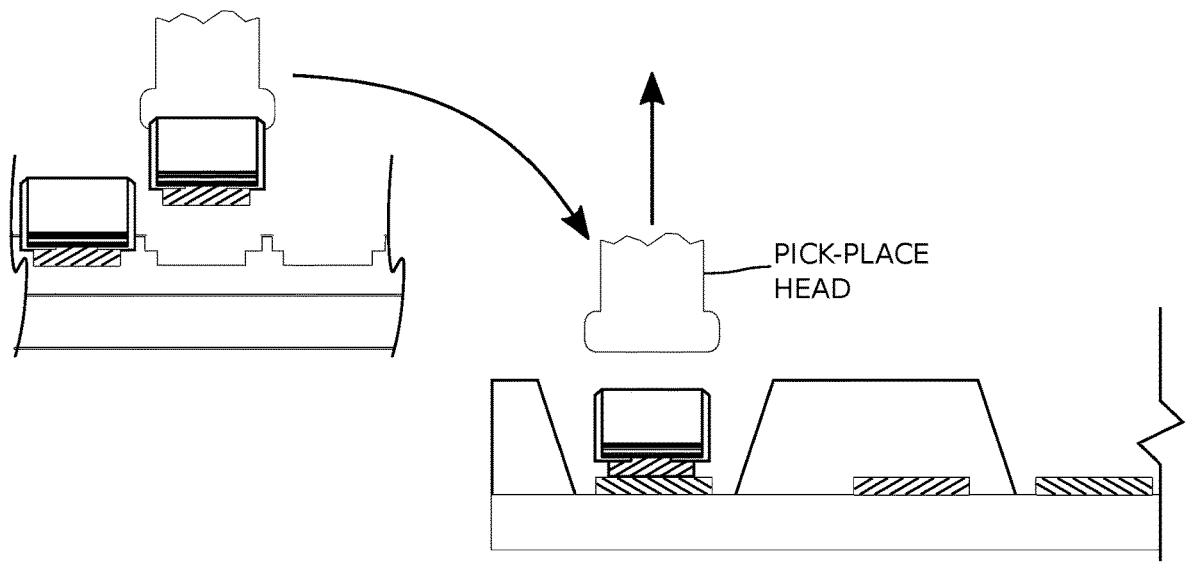
Figure 2C:
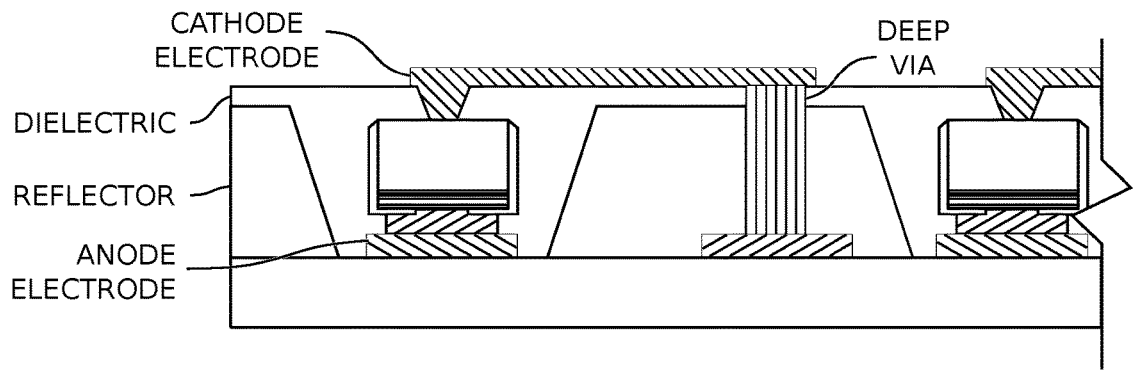
Figure 3A:
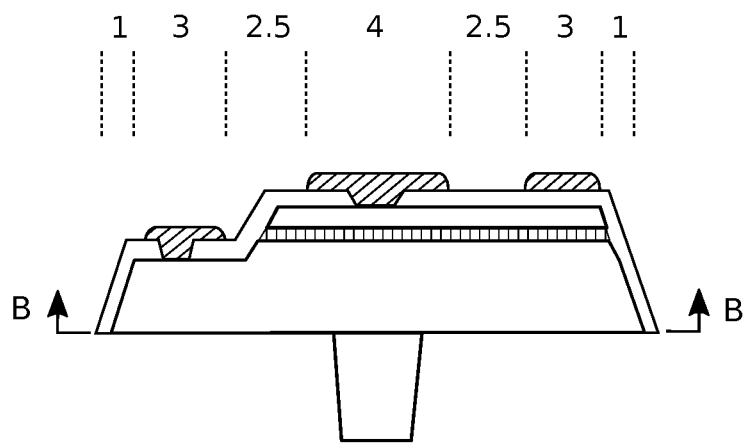
FIGS. 3A and 3B are, respectively, partial cross-sectional and planar views of a surface mount (SM) micro-LED.
Figure 3B:
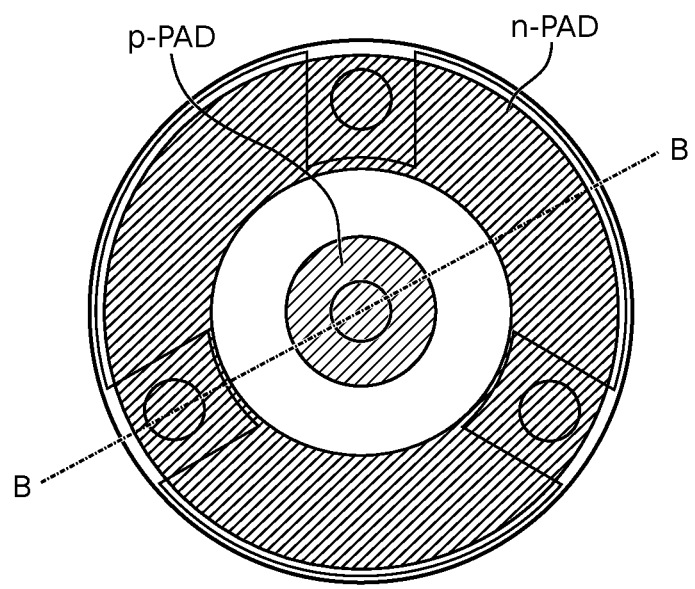
Figure 7A:
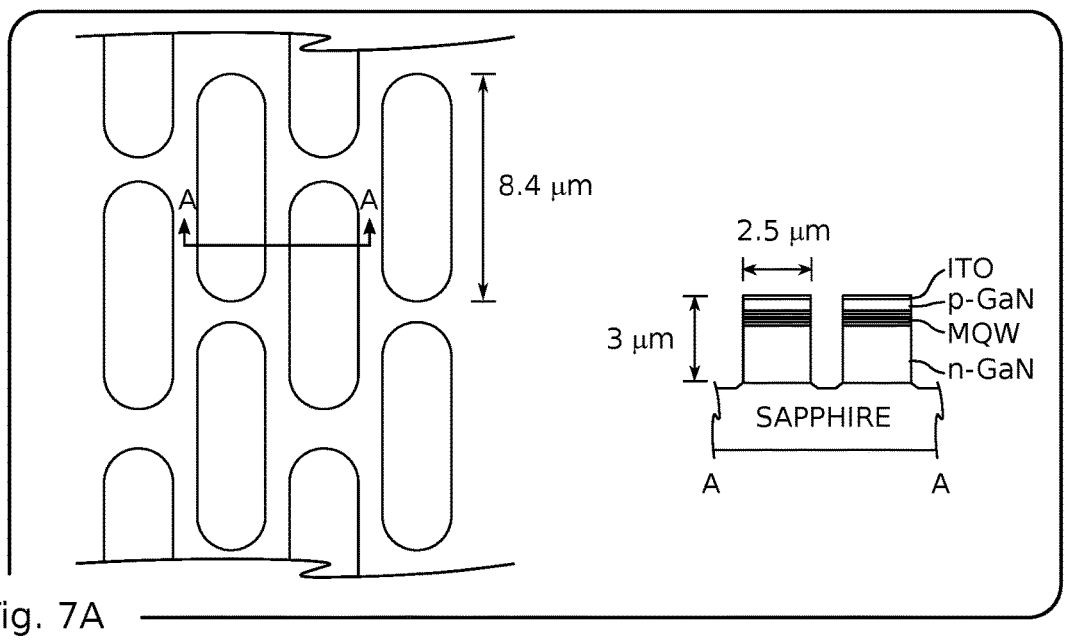
FIGS. 7A through 7E depict steps in the fabrication of an exemplary axial GaN micro($\mu$)-LED.
Figure 7B:
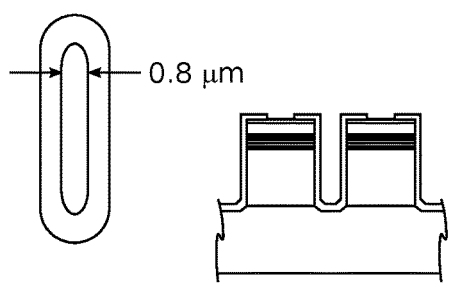
Figure 7C:
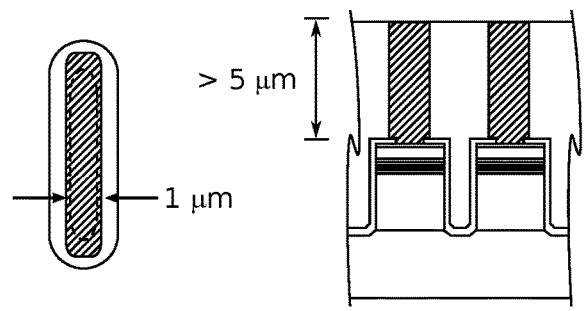
Figure 7D:
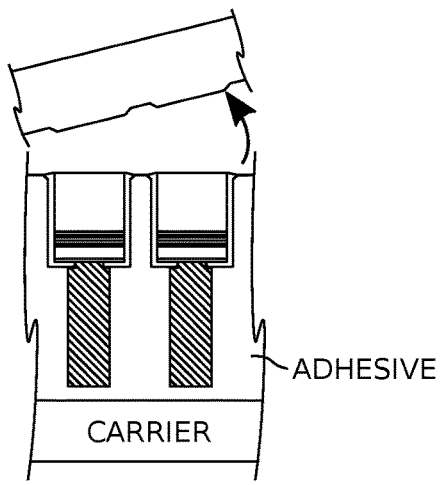
Figure 7E:
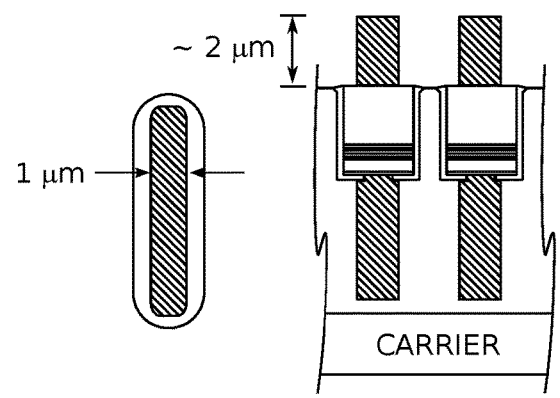

1) An LED stack is deposited on a sapphire wafer by MOCVD as described in the Background Section above. Other substrates such as silicon carbide (SiC) or silicon can be used, but sapphire substrates allow the µLEDs to be removed from the growth substrate by laser lift off (LLO), which dissociates GaN at the bottom device surface adjacent to the sapphire substrate. The MQW structure is tuned to produce the desired emission color and the resulting structure is about 3 µm thick, as shown in FIG. 7A. This thickness is critical for the oriented alignment as presented below, and may also be adjusted by etching after LLO. See also FIG. 1A for examples of the individual layers.

2) A current spreading layer is deposited on the p-GaN surface. The composition is typically a thin nickel oxide (NiO$_x$) interface layer plus a transparent conductive oxide such as indium tin oxide (ITO) which may be 50 to 150 nm thick.

3) The µLED electrode contact area is defined by photolithography and the full stack is etched down to the sapphire substrate typically using a chlorine based reactive ion etch (RIE) etch.

4) An insulating layer, which may be plasma-enhanced CVD (PECVD) silicon dioxide (SiO$_2$), PECVD silicon nitride (Si$_3$N$_4$), or ALD aluminum oxide (Al$_2$O$_3$) is deposited and patterned to prevent current leakage along the etched side-wall of the device, and to allow contact of the P-pad electrode to the current spreading layer. Optionally, this layer can be a DBR layer composed of alternating layers of dielectrics with different indices of refraction. The benefit of the DBR is its ability to reflect light in the direction of the viewer. The cost is that the DBR is thicker than a conventional dielectric so the spacing between micro-LEDs is greater and the wafer utilization decreases. See FIG. 7B.

5) A lithographic pattern is formed to define the shape of the P-pad electrode on the top surface in the form of an exemplary vertical blade. The electrode is bonded to the current spreading layer by a barrier layer which may be titanium (Ti)/titanium nitride (TiN), Ti/Ni or chromium (Cr)/gold (Au). A copper or gold electrode mounting wing is formed by a selective deposition or a damascene process to make an electrode about 5 µm tall, and the template material is removed. See FIG. 7C.

6) The wafer is bonded to a carrier with a suitable adhesive and the micro-LEDs are separated from the sapphire by use of a laser lift off process that dissociates the GaN at the sapphire surface. See FIG. 7D. Optionally, the GaN thickness may be decreased by RIE etching and the surface may be cleaned with hydrogen chloride (HCl) to remove metallic Ga.

7) A lithographic pattern is formed to define the shape of the N-pad electrode on the bottom surface in the form of a vertical blade. The electrode is bonded to the current spreading layer by a barrier layer which may be Ti/TiN, Ti/Ni or Cr/Au. The copper or gold electrode mounting wing is formed by a selective deposition or a damascene process to make an electrode about 2 µm tall, and the template material is removed. See FIG. 7E.

Completed axial micro-LEDs are removed from the carrier substrate using a suitable solvent to dissolve the adhesive and the micro-LEDs are suspended in a liquid suspension formulated for use in fluidic assembly.

Fluidic assembly of axial micro-LEDs proceeds by dispensing a suspension of micro-LEDs in a solvent such as water, isopropanol (IPA), acetone, or the like, over the display substrate. The fluid is disturbed by some means such as a brush or a blade, or a stream of solvent or gas to produce liquid flow across the substrate. As the micro-LEDs move across the substrate there are many trapping attempts as the micro-LEDs are caught and held in the substrate well structures to create a self-assembled array of micro-LEDs precisely positioned with surface mount electrode wings in contact with the electrical interface platforms in the substrate wells. When fluidic assembly is complete, as determined by an in-situ monitoring system that may use a camera and machine vision algorithms to determine assembly yield, the suspension fluid is removed and the display is completed by annealing to form a solder bond between micro-LEDs and the substrate electrodes.

Figure 8:
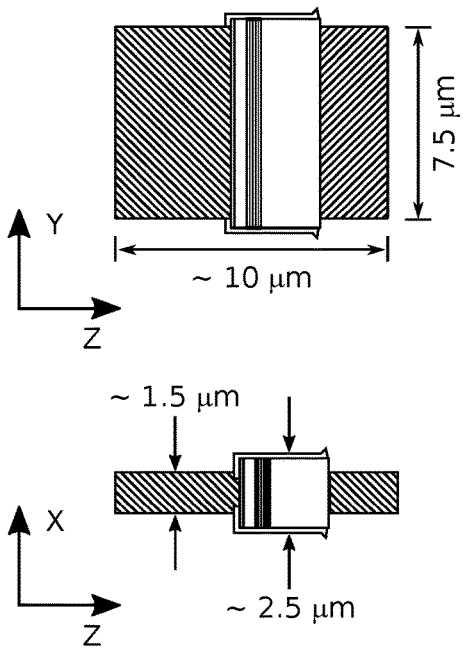
FIG. 8 depicts plan and partial cross-sectional views of an exemplary axial LED with dimensions of 10 $\mu$m in the z-axis by 2.5 $\mu$m wide in the x-axis.

FIG. 8 depicts plan and partial cross-sectional views of an exemplary axial LED with dimensions of 10 µm in the z-axis by 2.5 µm wide in the x-axis. The electrode mounting wings are 7.5 µm in length (y-axis) by 1.5 µm thick (x-axis). Fluidic assembly is inherently a random process, so the device and trap dimensions, as well as the assembly process parameters, are selected based on statistical analysis of trapping effectiveness. The micro-LEDs that result from the fabrication process all have critical dimensions such as width, thickness, and total length, as well as the size and configuration of the electrodes, which are configured to match the configuration of the wells and electrodes on the display substrate, so that the micro-LED can be assembled and bonded with the P-pad and N-pad electrode platforms connected to row and column interfaces respectively.

Figure 9:
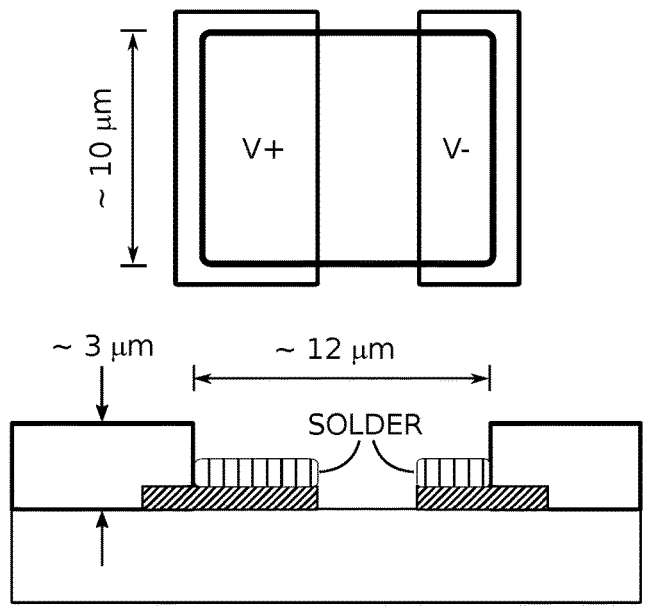
FIG. 9 depicts an exemplary LED interface with dimensions matching the axial LED of FIG. 8.

FIG. 9 depicts an exemplary LED interface with dimensions matching the axial LED of FIG. 8. Each subpixel LED interface is constructed with two electrode platforms on the substrate centered in a trapping groove structure with vertical walls (also referred to as a well). In this case the well opening is larger than the micro-LED outline by about 1 μm per side and the vertical dimensions are chosen so that a correctly aligned micro-LED can be recessed in the well, while an incorrectly oriented micro-LED includes a portion extending outside of the well. The substrate interconnect platform electrodes are composed of a suitable metal such as copper or aluminum to make electrical connection to the driving circuitry on the substrate. The top surfaces of the substrate electrode platforms have a layer of a suitable solder metal that can bond with the copper or gold electrode mounting wings of the micro-LED during thermal annealing. The solder material melts at a relatively low temperature so that an alloy of indium (In)/tin (Sn) or of gold (Au)/germanium (Ge) may be used. The fabrication of an exemplary row/column arrangement of a display and the thin-film transistor (TFT) driving circuit has been described in pending application Ser. No. 16/406,080, which is incorporated herein by reference.

Figure 10A:
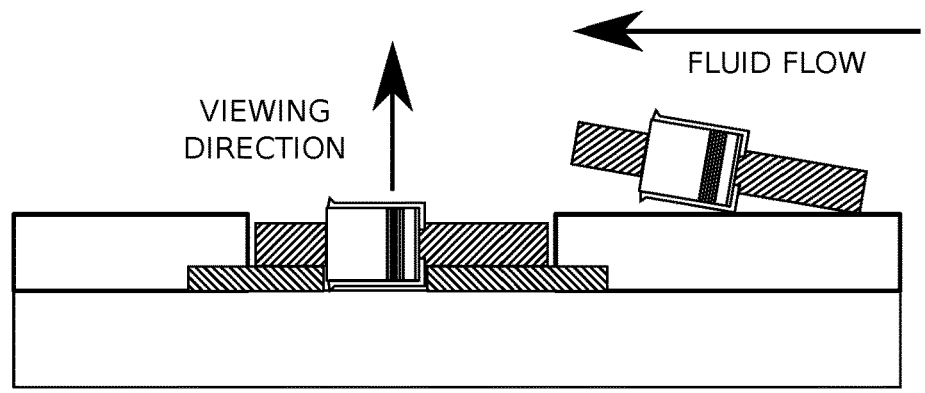
FIGS. 10A and 10B are drawings contrasting captured axial LEDs with misoriented axial LEDs during fluidic deposition.
Figure 10B:
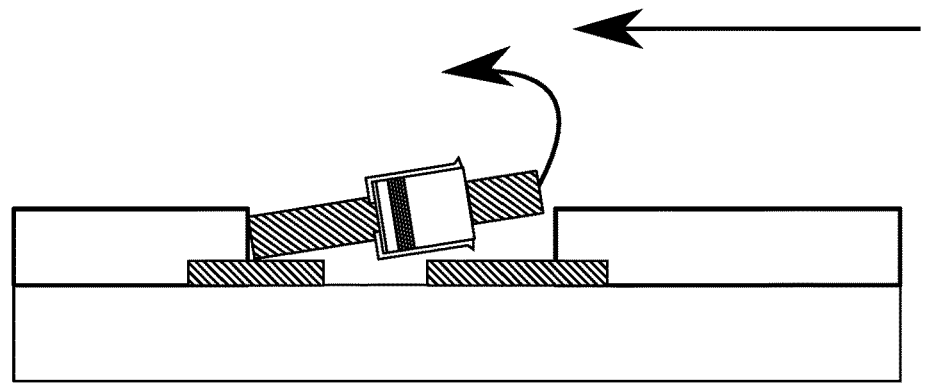

FIGS. 10A and 10B are drawings contrasting captured axial LEDs with misoriented axial LEDs during fluidic deposition. It is well known that fluid velocity increases parabolically from zero at the confining surface, so the force on a micro-LED increases with increasing distance from the substrate. When the suspension is first distributed over the substrate, micro-LEDs can be dispersed relatively quickly before settling onto the substrate surface. After reaching the substrate, micro-LEDs continue to move under the influence of the fluid flow and micro-LEDs tend move oriented with the larger anode electrode trailing as shown. In this orientation, when a micro-LED enters a well the device cross-section matches the profile of the well bottom. The captured micro-LED is recessed and out of the direct flow of the moving liquid, where it experiences low forces and does not interfere with the flow of other micro-LEDs. Conversely, if a micro-LED enters a well with the opposite orientation of anode and cathode as shown in FIG. 10B, the micro-LED profile does not fit the well profile and the micro-LED is tilted such that the trailing edge is higher in the fluid flow, resulting in a force that tends to detrap the micro-LED from the well and flip it to the opposite orientation.

The net result of many trapping events is that the wells are filled with micro-LEDs in position for bonding. It can be seen that the outline of the well must be larger than the micro-LED and the spacing between substrate electrode platforms must be greater than the height of the LED structure in order for both electrodes to make contact. The contact areas between the micro-LED mounting wing and substrate interconnect platform electrodes are large compared to the cross-sectional area of the LED emitter. This feature is important for low electrical resistance, but especially for the high thermal conductivity to carry heat away from the micro-LED to the interconnect and substrate when in operation.

In FIG. 10A it can be seen that the MQW is positioned vertically in this device so it may be desirable to add a light management structure (e.g., DBR, see FIG. 5D) to the device to direct the emitted light upward in the direction of the viewer. A typical DBR structure might consist of several layers of dielectric with alternating index of refraction (n) arranged to maximize reflection at the wavelength of micro-LED emission. The reflectance of the DBR can be increased with more layers but this also requires increased spacing between micro-LEDs on the growth substrate, which in turn decreases the efficiency of wafer usage and increases the materials cost per pixel. An exemplary DBR for emission at 440 nm has five layers arranged as follows:

1) $SiO_2$ (n=1.505) 220 nm thick
2) $TiO_2$ (n=2.616) 40 nm thick
3) $SiO_2$ (n=1.505) 75 nm thick
4) $TiO_2$ (n=2.616) 40 nm thick
5) $SiO_2$ (n=1.505) 150 nm thick If a DBR layer is added to the structure during fabrication, it surrounds the perimeter of the device and the top surface, except for the contact opening reflecting light inward. To open a window for emission upward, the DBR is removed on the top of the micro-LED by a directional plasma etch process after assembly and bonding. Thus, light is reflected from the DBR around the perimeter and from the electrodes on each end so that the majority of light emitted in the MQW is presented in the direction of the display viewer.

Figure 11:
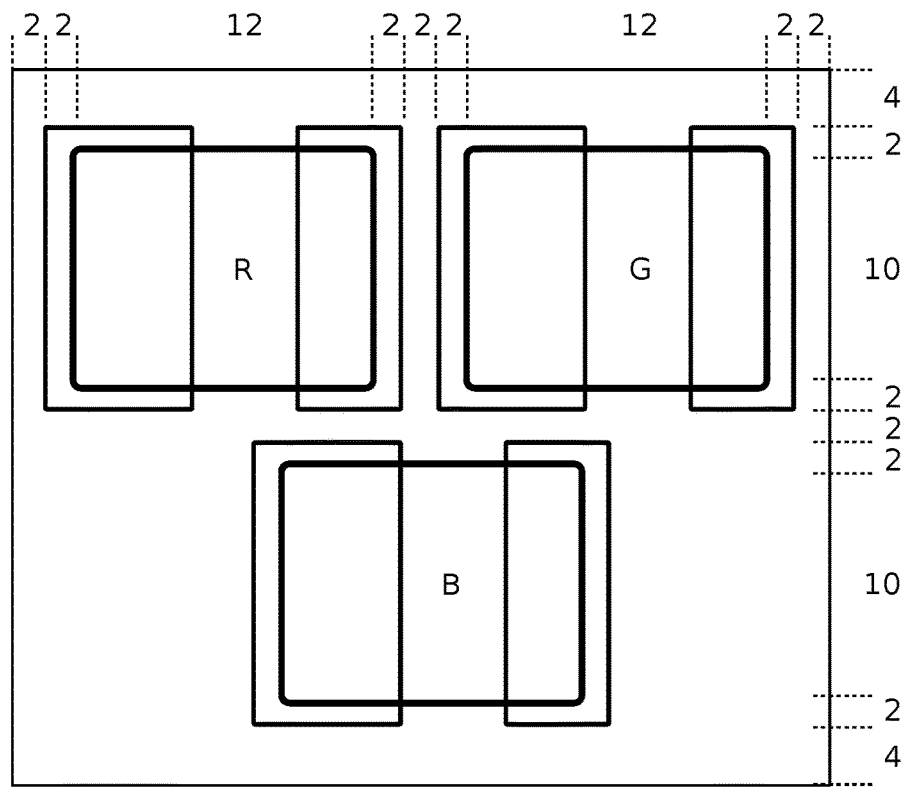
FIG. 11 is a plan view of an RGB pixel using axial LEDs.

FIG. 11 is a plan view of an RGB pixel using axial LEDs. An RGB display has three subpixels which work together to make up each image pixel, so the highest resolution attainable by a given technology is determined by how effectively the components of a pixel can be integrated together. The subpixel of FIG. 10A, for example, can be constructed on a substrate with TFT drivers and interconnects using 2 μm design rules so the minimum space and feature size is 2 μm, as shown for example in FIG. 11. Based solely on the geometry required by the micro-LED subpixel, the minimum pixel size is about 38×38 microns, which is a resolution of 668 ppi. For reference, an 8K display at 668 ppi is about 11.5 by 6.5 inches or tablet size, while a 4K display is less than cell phone size at 5.7 by 3.2 inches. Details of the circuitry supporting the micro-LED component are important for a completed design. Considerations such as color conversion, transistor performance, or interconnect resistance may ultimately be the limiting factors which dictate pixel size.

Figure 12:
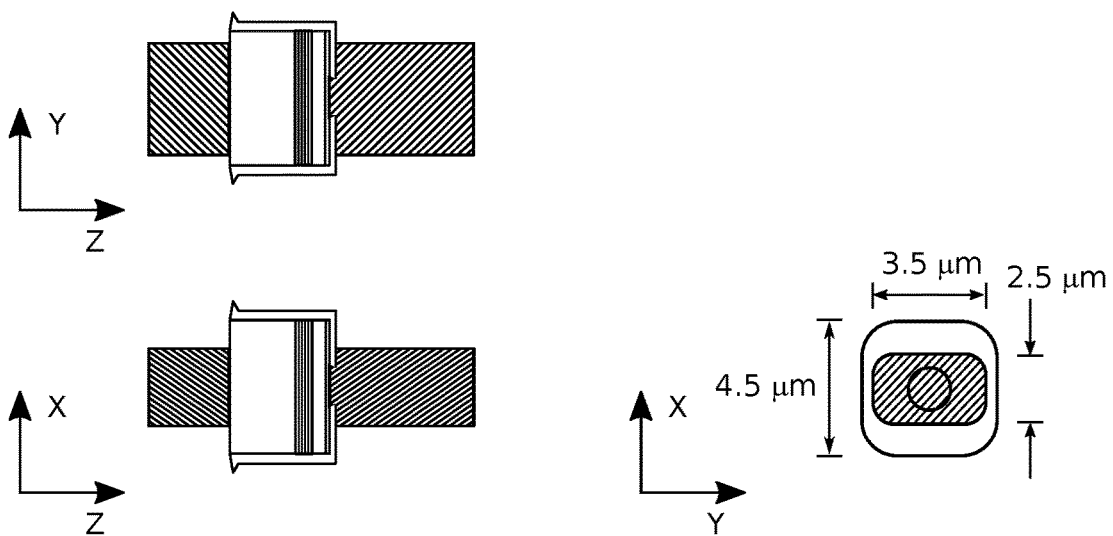
FIG. 12 is a diagram depicting an exemplary axial LED with a "square" body.

FIG. 12 is a diagram depicting an exemplary axial LED with a "square" body. The exemplary shapes described by FIG. 11 are not a unique solution and other related shapes of a similar size work in a similar fashion. If the outline of an axial micro-LED is a square 4.5 (x-axis) by 4.5 μm (y-axis), then the emissive area is slightly larger at about 20 μm² depending on corner rounding. If the axial micro-LED is fabricated with asymmetric electrode extensions as described above (see FIG. 5A), the result is the device shown with a 1.5 μm diameter contact opening and electrode wings about 2.5 μm wide (x-axis) by 3.5 μm long (y-axis).

Figure 13A:
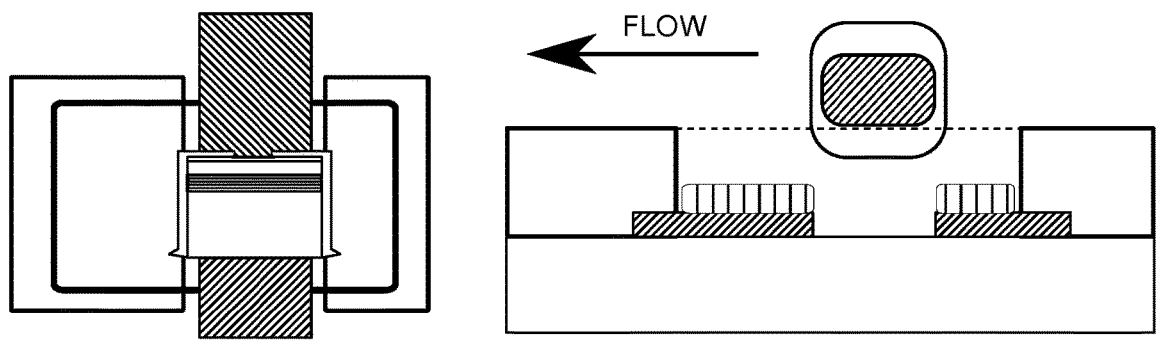
FIGS. 13A through 13C depict top down plan and partial cross-sectional views of an axial micro-LED with a matching well structure.
Figure 13B:
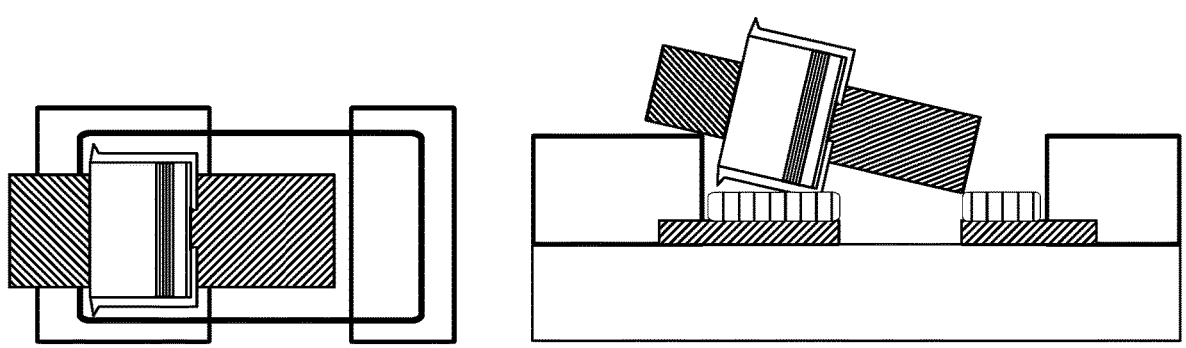
Figure 13C:
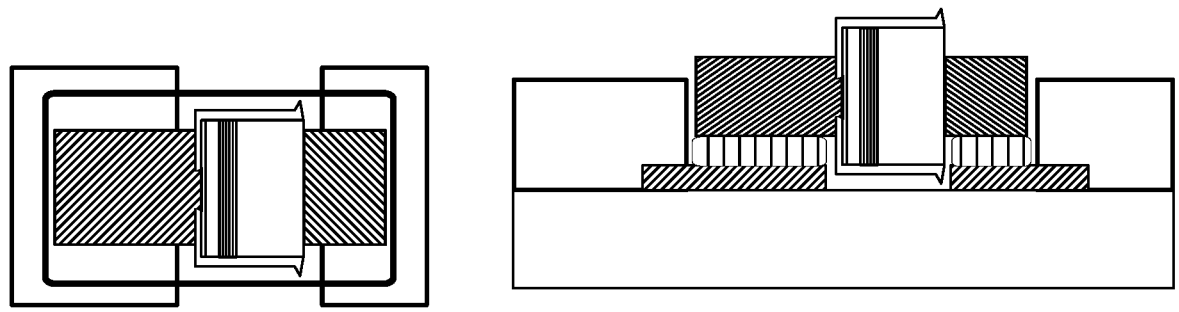

FIGS. 13A through 13C depict top down plan and partial cross-sectional views of an axial micro-LED with a matching well structure. In FIG. 13A it can be seen that the electrode wings bridge the structure for large angles with respect to the flow direction, preventing capture. In FIG. 13B the micro-LED is misoriented with the cathode and anode in reversed positions, and capture is prevented because the body of the micro-LED is not positioned in alignment with the groove (space) between substrate interconnect platform electrodes. With the correct orientation shown in FIG. 13C the shape of the micro-LED and the well are correctly matched so that capture and subsequent bonding can occur.

Figure 14:
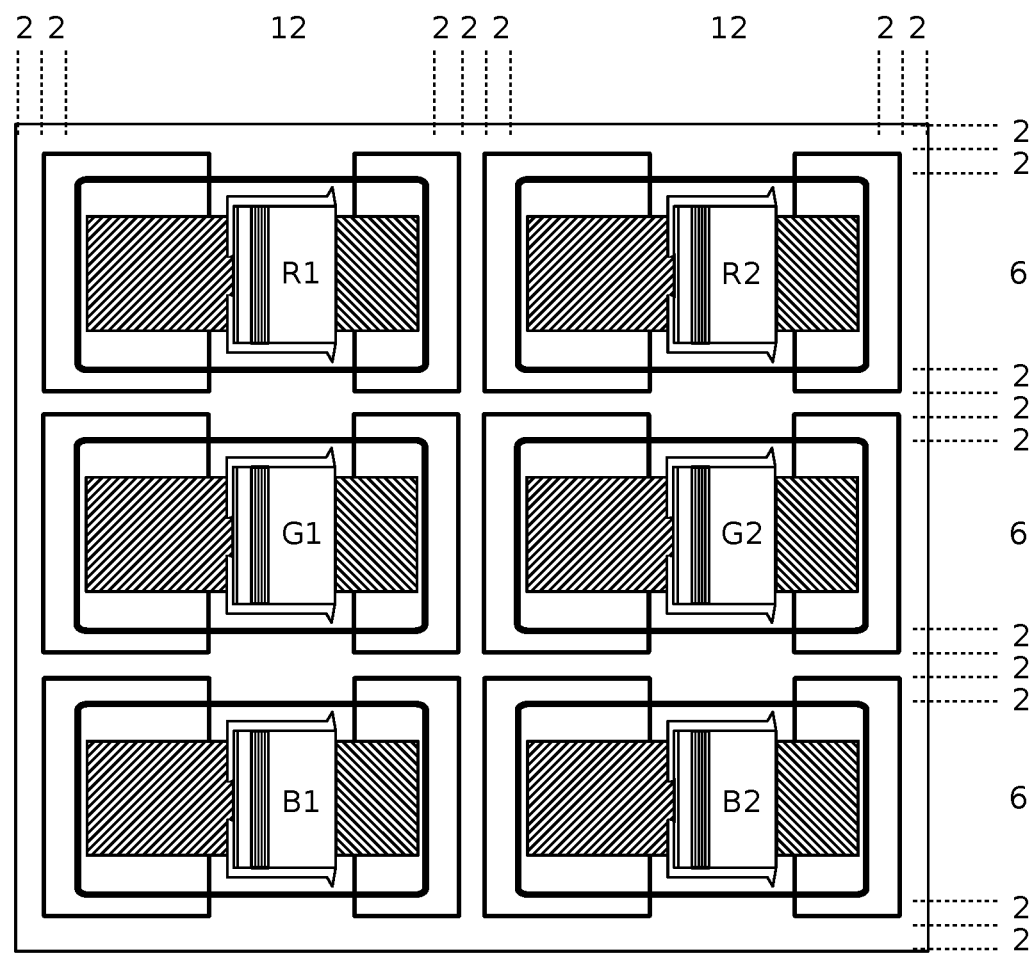
FIG. 14 is a plan view of an axial LED RGB pixel with 2× redundancy.

FIG. 14 is a plan view of an axial LED RGB pixel with 2× redundancy. The length of the subpixel cell for a square micro-LED is the same as for the blade-shaped micro-LED, so the smallest achievable resolution is also 668 ppi. However, the narrower sub-pixel allows for an RGB pixel with 2× redundancy in the same 38×38 µm footprint as the simple pixel of FIG. 11. The uses and benefits of redundancy are described in pending application Ser. No. 16/406,080, which is incorporated herein by reference.

Figure 15A:
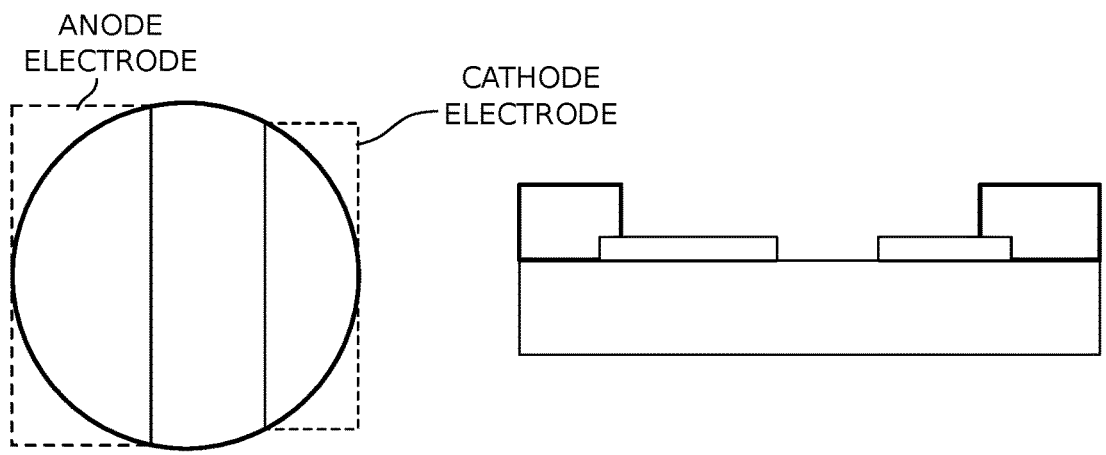
FIGS. 15A through 15D depict plan and partial cross-sectional views of a circular well structure.
Figure 15B:
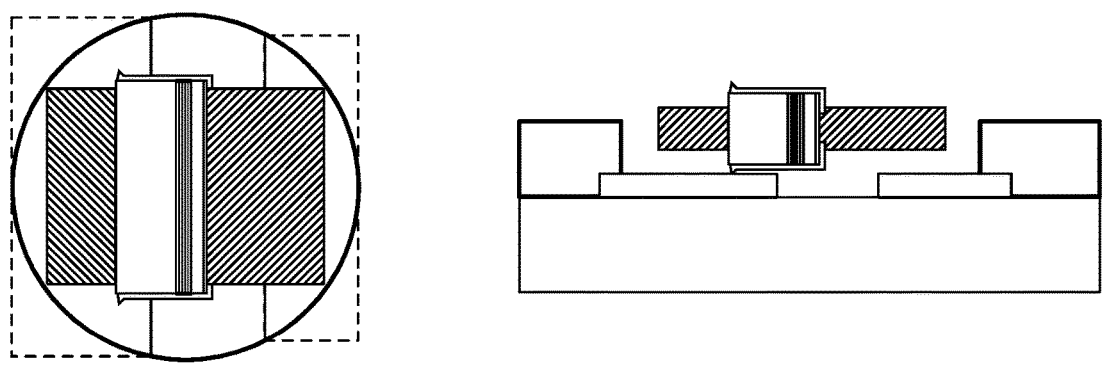
Figure 15C:
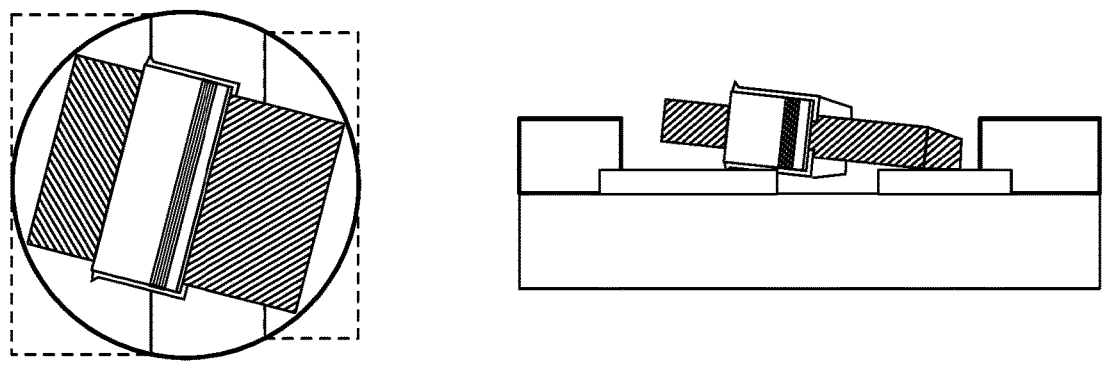
Figure 15D:
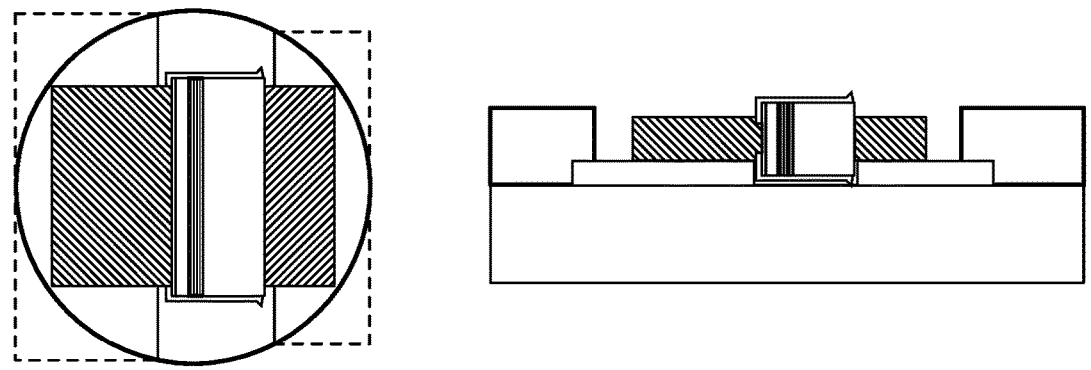

FIGS. 15A through 15D depict plan and partial cross-sectional views of a circular well structure. Successful fluidic assembly requires appropriately processing the micro-LED such that the most stable configuration is also the correct location and orientation for bonding to the substrate, and a variety of configurations can use this general configuration. The success of fluidic assembly using the simple disk shaped micro-LEDs presented in Ser. No. 16/406,080 is in part because the micro-LEDs are symmetric about the vertical axis when oriented post (keel) up so there is no theta dependence of trapping. That is not the case for the axial-shaped devices presented herein, so an axial micro-LED that is not aligned within the tolerance of the well shape will not be trapped. Thus it can be important to modify the well structure to increase the probability of trapping as shown, where the well structure is now circular to accept the micro-LED in any orientation about the vertical axis. In this case the well size is chosen to be 0.75 µm per side larger that the inscribed area of the micro-LED or 14 µm in diameter. With this structure fluidic assembly becomes a two-stage process where the micro-LED is captured (FIG. 15B) by the well structure at some random orientation which may not be directly along the direction of flow. The captured micro-LED then moves within the well under the forces applied by the moving liquid and contact with other micro-LEDs (FIG. 15C). The localization provided by the circular well increases the probability that a perturbation leads to the orientation of FIG. 15D, allowing the micro-LED body to fit between the substrate interconnect platform electrodes, which in turn decreases the strength of further perturbations.

Figure 16:
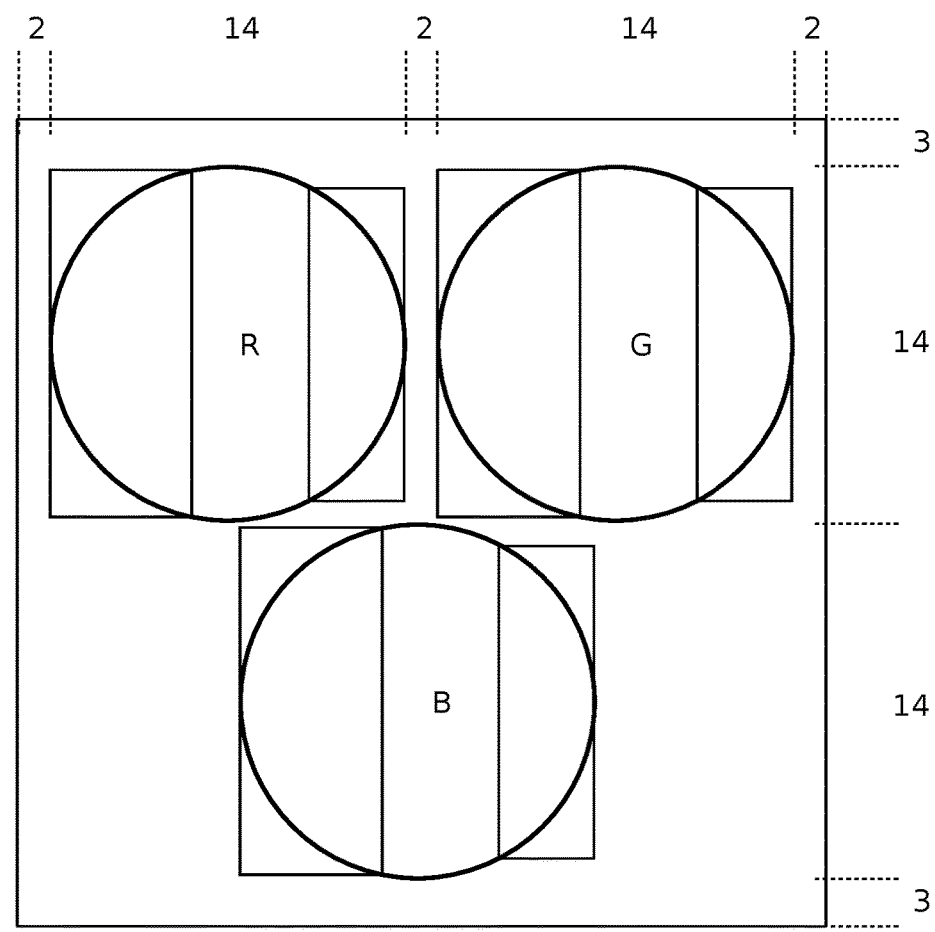
FIG. 16 is a plan view of an axial LED RGB pixel fabricated with circular wells using 2 $\mu$m design rules.

FIG. 16 is a plan view of an axial LED RGB pixel fabricated with circular wells using 2 µm design rules. A pixel dimension of 34 by 34 µm can be achieved at a resolution of 747 ppi. At that pixel size the smallest 8K display is about 10.3 by 5.8 inches. A 4K display is less than cell phone size at 5.2 by 2.9 inches, and a personal display of 1.5 by 1 inch at that resolution is nearly that of HD resolution.

FIGS. 17A and 17B depict alternative axial LED and substrate well keying features based upon the use of different length LED electrode mounting wings.

Figure 18C:
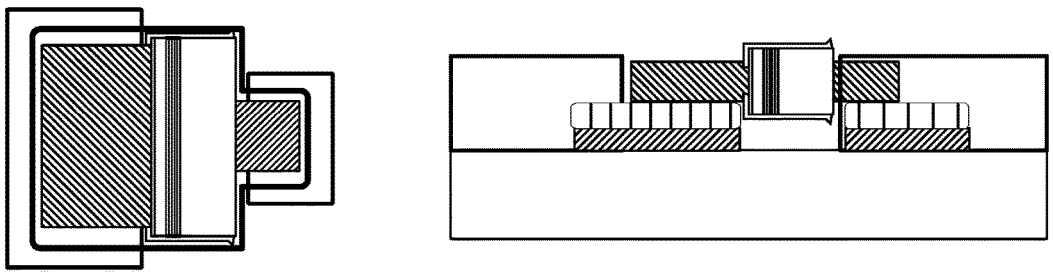

FIG. 18A through 18C are plan and partial cross-sectional views respectively depicting the axial LED of FIG. 17A in random, reversed, and correct orientation for substrate bonding. This alternate architecture produces a higher selectivity to orientation, at the cost of lower capture probability for micro-LEDs with rotational misalignment. The micro-LED is fabricated as described above, except that the cathode electrode width is decreased as shown to about 3 µm in this example. The well shape and negative substrate interconnect platform electrode are modified to accommodate the shape as shown in FIG. 18B. In this configuration the narrow end of the well supports a misaligned micro-LED with more cross-sectional area exposed to fluid flow, increasing the force to flip the device as shown.

Figure 19:
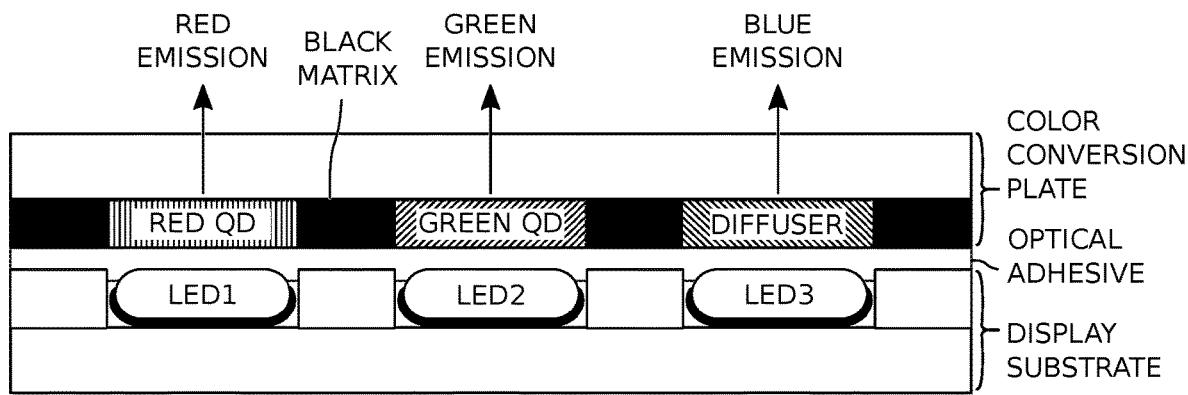
FIG. 19 is a partial cross-sectional view of an RGB pixel using blue axial micro-LEDs and quantum dot color converters.

FIG. 19 is a partial cross-sectional view of an RGB pixel using blue axial micro-LEDs and quantum dot color converters. If the display pixels have only one color of micro-LED (e.g., blue), additional structures are required to produce the three complementary colors of an RGB display. Taking as an example the pixel of FIG. 14, all six micro-LED sites are assembled with blue emitting micro-LEDs (peak from 430 to 455 nm) with the emitted light passing through a color conversion plate that is laminated over the display substrate using an optically transparent adhesive. As shown, the color conversion plate has an array of printed color conversion regions formed of an organic material containing quantum dots, which absorb blue light and re-emit either green or red light. Thus, to produce red emission, LED1 is energized to emit blue light, which in turn is absorbed and re-emitted in the red by the quantum dots in the color conversion plate. Similarly, green emission is produced by energizing LED2 to excite the green quantum dots. For blue light the color conversion plate uses a diffuser to change the angular dependence of emission from LED3 to match the emission pattern of the red and green color converters. Each color conversion region is surrounded by an absorbing material referred to as the black matrix, which prevents light from passing between two adjacent subpixels. Color conversion by quantum dots has been described is U.S. Pat. No. 10,249,599, which is incorporated herein by reference.

Figure 20A:
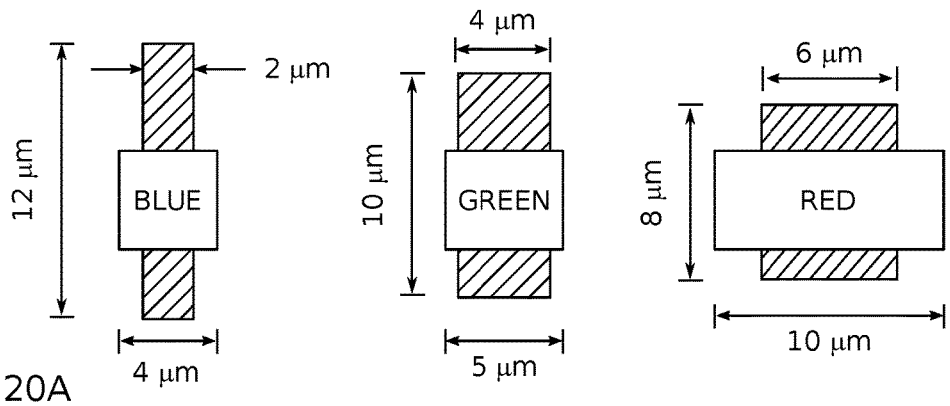
FIGS. 20A and 20B respectively depict different emissive wavelength axial LED and substrate LED interface plan views.
Figure 20B:
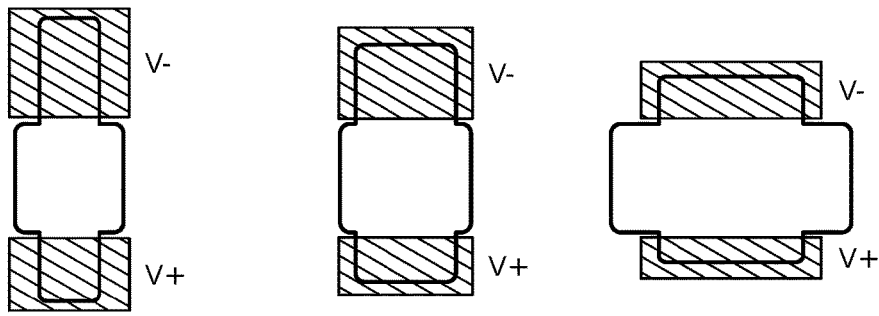

FIGS. 20A and 20B respectively depict different emissive wavelength axial LED and substrate LED interface plan views. As an alternative to an RGB pixel made using a single color LED, axial micro-LEDs with the three different emission wavelengths can be used, which avoids the lower efficiency of wavelength conversion by quantum dots. The use of different wavelength LEDs requires that the fluidic assembly process separately position three different types of micro-LEDs for red, green, and blue emission. The surface mount axial micro-LED structure has considerable flexibility in the selection of sizes and shapes and it is possible to design a system with three mutually exclusive shapes, so that the micro-LED assembled first can only fit in one of the three available well structures, the micro-LED assembled next can only fit in the second well structure, and the third assembly fills the remaining site in the pixel.

There are two main effects which govern the selection of emitter areas for the three display colors. First, GaN based micro-LEDs have the highest efficiency for emission in the blue color wavelength, with significantly lower efficiency for green and quite poor efficiency for red emission. The other factor which must be considered is the relative sensitivity of the human vision system, which has the highest sensitivity in the green and dropping to nothing in the infrared and ultraviolet. Because of these factors, the relative area of red, green, and blue micro-LEDs can be chosen to be in the ratio 2:1:0.8 in the following discussion of the micro-LED shapes used for shape exclusion fluidic assembly. Beginning with the square device in FIG. 12, the blue micro-LED is 4×4 µm for an emitter area of 16 µm$^2$, the green micro-LED is 4×5 µm (20 µm$^2$), the red micro-LED is 4×10 µm (40 µm$^2$), and all of the micro-LEDs are about 4 µm thick. It should be understood that these exemplary values may vary in response to considerations such as size, and relative LED emission and light extraction efficiencies.

Following the process flow described above, the axial micro-LEDs are fabricated with different electrode lengths and widths to make three unique shapes as shown in FIG. 20A. The display substrate has pixels with three matching well shapes with positive and negative driving interconnect platform electrodes positioned to make contact with the respective cathode and anode mounting wing electrodes on the micro-LED as shown in FIG. 20B. For each subpixel the spacing between electrodes is larger than the thickness of the micro-LED stack, so the body of the device fits in the space provided. Fluidic assembly can proceed simultaneously (three types of micro-LED in one suspension) or sequentially.

Figure 21A:
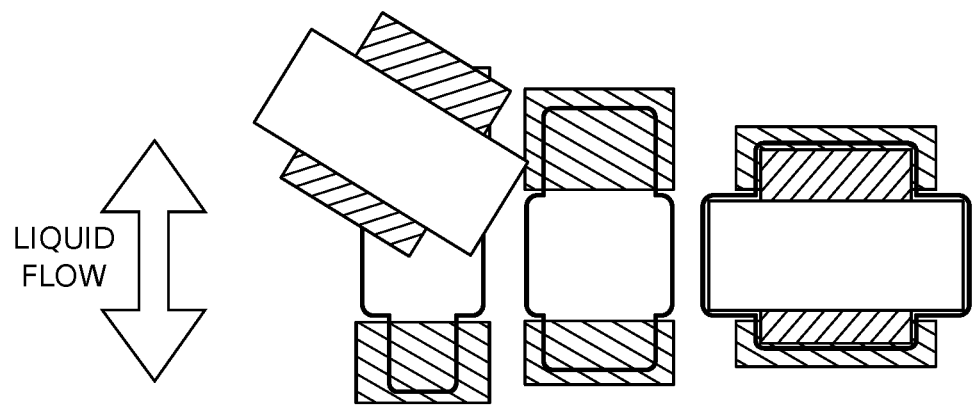
FIGS. 21A through 21C depict the successive fluidic assembly of the red, green, and blue axial micro-LEDs shown in FIG. 20A.
Figure 21B:
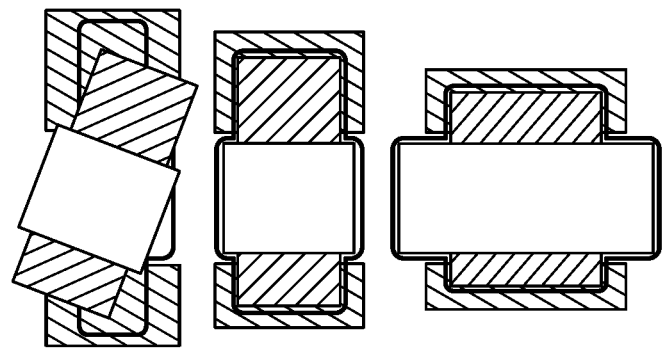
Figure 21C:
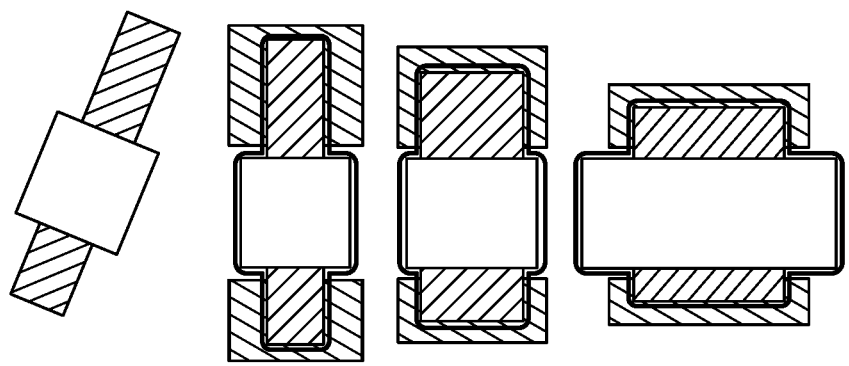

FIGS. 21A through 21C depict the successive fluidic assembly of red, green, and blue axial micro-LEDs shown in FIG. 20A. In the case of sequential assembly, a suspension of red axial micro-LEDs is supplied on the surface of the display substrate with an excess of micro-LEDs and the fluid is forced by some method to cause a flow of micro-LEDs as shown in FIG. 21A. When assembly is complete the excess red micro-LEDs are cleaned from the surface and recycled. A suspension of green micro-LEDs is dispensed on the surface and assembly proceeds by moving the liquid over the surface so that green micro-LEDs can be trapped by the matching well structure as shown in FIG. 21B. When all of the green subpixels are populated, the excess green micro-LEDs are cleaned from the substrate and recycled. The assembly of blue micro-LEDs proceeds in the same way resulting in the fully populated pixel shown in FIG. 21C. After all of the micro-LEDs are assembled, the fluid used for assembly is dried and the substrate is heated to form the solder bond between substrate electrodes and the electrodes on the micro-LEDs.

As shown in the previous figures, the depth of the well structure and the shape of the bottom surface formed by the substrate interconnect platform electrodes are chosen so that a correctly assembled micro-LED is below the surrounding surface to minimize the disturbance caused by liquid flow or the passage of other micro-LEDs. This is of particular importance so that successive assembly, clean and dry operations do not disturb previously assembled micro-LEDs.

Figure 22:
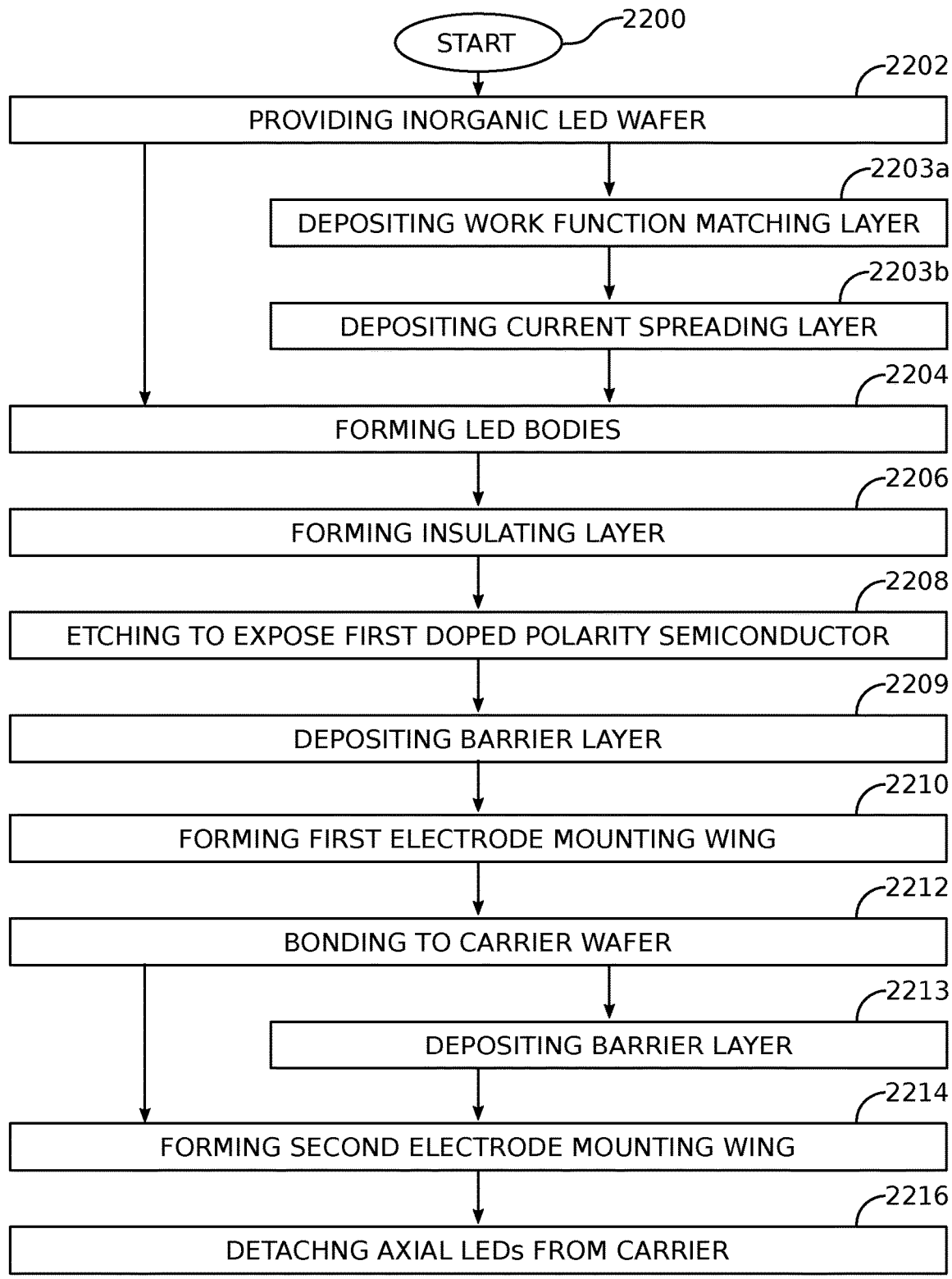
FIG. 22 is a flowchart illustrating a method for fabricating an axial LED.

FIG. 22 is a flowchart illustrating a method for fabricating an axial LED. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and support for the various steps can be found in the device descriptions and fabrication details presented above. The method starts at Step 2200.

Step 2202 provides an inorganic LED wafer on a growth substrate, comprising stacked semiconductor horizontal layers in parallel xy-axes planes. As described above, a GaN LED wafer comprises an n-GaN semiconductor layer, a MQW layer overlying the n-GaN layer, and a p-GaN layer overlying the MQW layer. An AlGaInP LED wafer comprises an n-GaInP semiconductor layer, a MQW layer overlying the n-GaInP layer, and a p-AlGaInP layer overlying the MQW layer. Step 2204 selectively etches the LED wafer down to the growth substrate, forming a plurality of exposed LED bodies. The LED bodies may have a y-axis length greater than or equal to the LED body width. Further, the LED bodies may have a z-axis height greater than or equal to the LED body width. Step 2206 forms an insulating layer overlying the LED bodies. The insulating layer may be made of a material such as PECVD $SiO_2$, PECVD $Si_3N_4$, ALD $Al_2O_3$, or DBR.

Step 2208 etches the insulating layer of each LED body to expose a region of first doped polarity semiconductor. Step 2209 deposits a barrier layer overlying the etched insulating layer. For each LED body, Step 2210 forms a first electrode mounting wing connected to the exposed first doped polarity semiconductor region. The first electrode mounting wing is formed in a zy-axes plane orthogonal to the xy-axes planes. Step 2212 bonds the LED wafer to a carrier substrate and separates the LED bodies from the growth substrate. Step 2214 forms a second electrode mounting wing in the same zy-axes plane as the first electrode mounting wing, connected to a second doped polarity semiconductor region of each LED body, where the second doped polarity is opposite of the first doped polarity. Step 2216 detaches completed axial LEDs from the carrier substrate.

In one aspect, prior to forming the plurality of LED bodies in Step 2204, Step 2203a deposits a work function matching layer overlying the LED wafer. Step 2203b deposits a current spreading layer overlying the work function matching layer. In one aspect, Step 2209 deposits a barrier layer made from a material such as titanium/titanium nitride (Ti/TiN), Ti/nickel (Ti/Ni), or chromium/gold (Cr/Au). In another aspect, subsequent to bonding the LED wafer to the carrier substrate in Step 2212, Step 2213 deposits a barrier layer overlying the LEDs using a material such as Ti or Cr.

As described in detail above, forming the LED bodies in Step 2204 includes forming LED bodies each having an x-axis width, and forming the first and second electrode mounting wings respectively in Steps 2210 and 2214 includes forming first and second electrode mounting wings having a zy-axes plane bisecting the LED body width. Typically, the first and second electrode mounting wing x-axis widths are less than the LED body width, creating symmetrical LED body locking teeth extending beyond the x-axis widths of the first and second electrode mounting wings.

In one aspect, forming the first electrode mounting wings in Step 2210 includes forming the first electrode mounting wings with a z-axis first extension, and forming the second electrode mounting wings in Step 2214 includes forming the second electrode mounting wings with a z-axis second extension, less than the first extension. In another aspect, Step 2210 forms the first electrode mounting wings with a y-axis first length, and Step 2214 forms the second electrode mounting wings with a y-axis second length, less than or equal to the first length.

Figure 23:
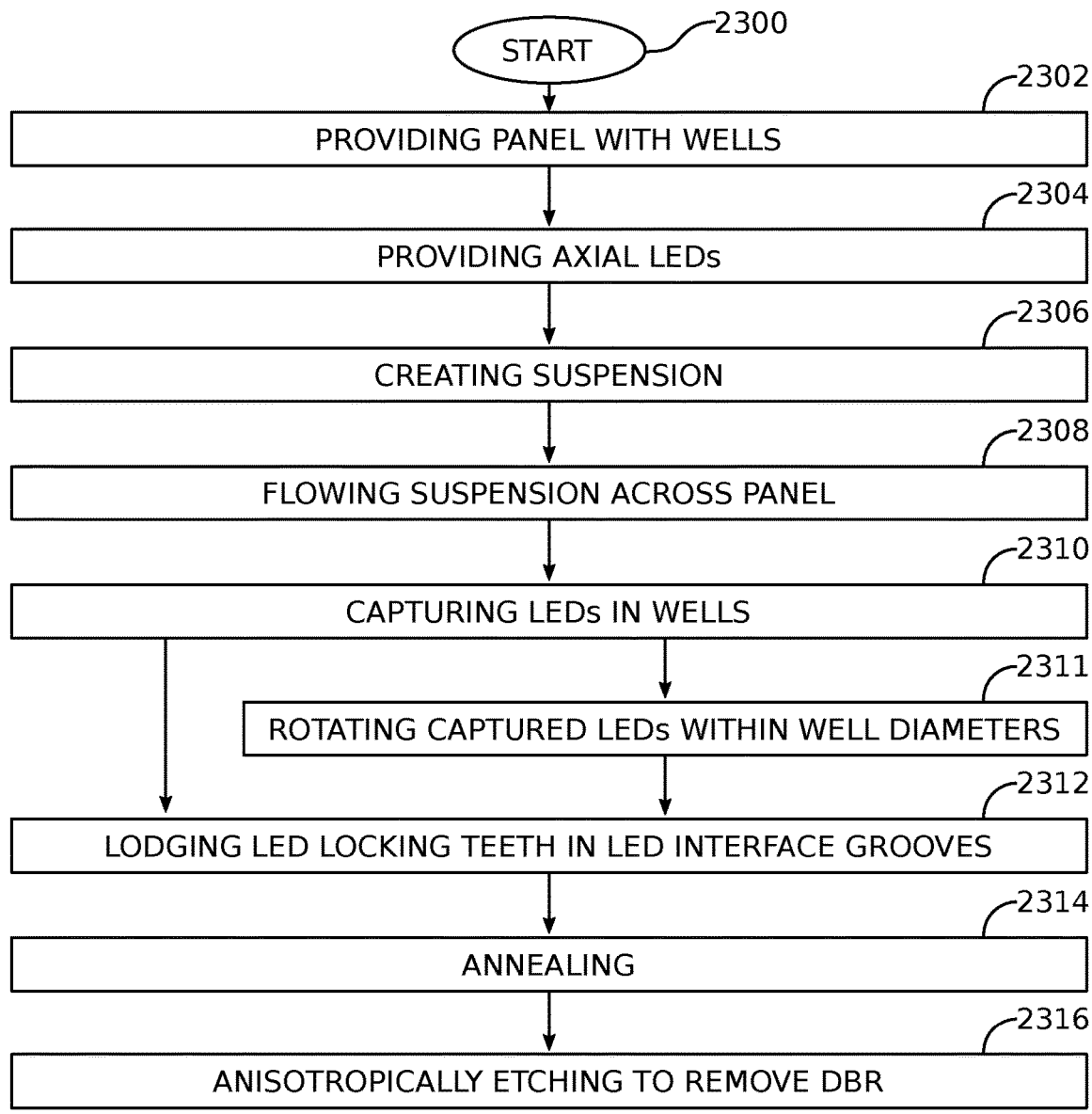
FIG. 23 is a flowchart illustrating a method for the fluidic assembly of emissive display panels.

FIG. 23 is a flowchart illustrating a method for the fluidic assembly of emissive display panels. The method begins at Step 2300. Step 2302 provides a panel with a plurality of wells exposing LED interfaces. As described in detail above, each LED interface comprises a planar first interconnect platform having an x-axis first depth, a planar second interconnect platform having the x-axis first depth, and a groove interposed between the first and second interconnect platforms and having an x-axis second depth, greater than the first depth. Step 2304 provides axial LEDs. Each axial LED comprises an inorganic LED body with two symmetrical locking teeth, a first electrode mounting wing aligned in a plane orthogonal to stacked LED body semiconductor layers, and a second electrode mounting wing aligned in the plane orthogonal to the stacked semiconductor layers.

Step 2306 adds the LEDs to a liquid to create a suspension of LEDs. Step 2308 flows the suspension across the panel. Step 2310 captures LEDs within the wells, and Step 2312 lodges LED locking teeth in corresponding LED interface grooves. In one aspect, Step 2302 provides a panel with solder-coated LED interface interconnect platforms. Then, Step 2314 anneals the panel to electrically connect the LED electrode wings to the LED interface interconnect platforms.

In another aspect, Step 2302 provides a panel with a plurality of pixel groups. Each pixel group includes n number of LED interface surfaces, where the LED interfaces in each pixel group are mutually distinguished by a characteristic such as well shape, first interconnect platform shape, second interconnect platform shape, groove shape, or combinations thereof. Step 2304 provides n types of LEDs mutually distinguished by a characteristic such as LED body height, LED body length, electrode wing extension, electrode wing length, or combinations thereof. Then, flowing the suspension in Step 2308 includes flowing a suspension including a combination of all n types of LEDs. Alternatively, Step 2308 sequentially flows n suspensions with the corresponding different types of LEDs.

In yet another aspect, Step 2304 provides LEDs with a DBR coating, and subsequent to lodging LED locking teeth in corresponding LED interface grooves (Step 2312), Step 2316 anisotropically etches the LEDs to remove exposed DBR.

In the case that Step 2302 provides a panel with circular wells, Step 2310 captures randomly aligned LEDs within the diameter of the wells, and additional Step 2311 rotates captured LEDs within the well diameters in response to the suspension flow. Then, in response to rotating the captured LEDs, Step 2312 lodges LED locking teeth in corresponding LED interface grooves.

Axial LEDs, axial LED display panels, and associated fabrication processes have been provided. Examples of particular circuit layouts, geometries, and explicit process steps have been presented to illustrate the invention. However, the invention is not limited to merely these examples. Other variations and embodiments of the invention will occur to those skilled in the art.

We claim:

1. An axial light emitting diode (LED) comprising:
    an inorganic LED three-dimensional body comprising stacked semiconductor horizontal layers in parallel xy-axes planes with an x-axis width;
    a first electrode mounting wing connected to a first doped polarity semiconductor layer of the LED body and aligned in a zy-axes plane orthogonal to the xy-axes planes, bisecting the LED body width, with a z-axis first extension;
    a second electrode mounting wing connected to a second doped polarity semiconductor layer of the LED body, opposite in polarity to the first doped polarity, and aligned in the same zy-axes plane as the first electrode mounting wing, bisecting the LED body width, with a z-axis second extension less than or equal to the first extension; and,
    wherein the first and second electrode mounting wings have x-axis widths less than the LED body width, forming symmetrical LED body locking teeth extending beyond the x-axis widths of the first and second electrode mounting wings.

2. The axial LED of claim 1 wherein the first electrode mounting wing has a y-axis first length and the second electrode mounting wing has a y-axis second length, less than or equal to the first length.

3. The axial LED of claim 1 wherein the LED is a gallium nitride (GaN) LED and the LED body comprises:
    an n-doped GaN (n-GaN) semiconductor layer;
    a multiple quantum well (MQW) layer overlying the n-GaN layer; and,
    a p-doped GaN (p-GaN) layer overlying the MQW layer.

4. The axial LED of claim 1 wherein the LED is an aluminum gallium indium phosphide (AlGaInP) LED and the LED body comprises:
    an n-doped GaInP (n-GaInP) semiconductor layer;
    a MQW layer overlying the n-GaInP layer; and,
    a p-doped AlGaInP (p-AlGaInP) layer overlying the MQW layer.

5. The axial LED of claim 1 further comprising:
    a distributed Bragg reflector (DBR) coating overlying the LED body.

6. A method for fabricating an axial light emitting diode (LED), the method comprising:
    providing an inorganic LED wafer on a growth substrate, comprising stacked semiconductor horizontal layers in parallel xy-axes planes;
    selectively etching the LED wafer down to the growth substrate, forming a plurality of exposed LED bodies;
    forming an insulating layer overlying the LED bodies;
    etching the insulating layer of each LED body to expose a region of first doped polarity semiconductor;
    depositing a barrier layer overlying the etched insulating layer;
    for each LED body, forming a first electrode mounting wing connected to the exposed first doped polarity semiconductor region, the first electrode mounting wing formed in a zy-axes plane orthogonal to the xy-axes planes;
    bonding the LED wafer to a carrier substrate and separating the LED bodies from the growth substrate;
    forming a second electrode mounting wing in the same zy-axis plane as the first electrode mounting wing, connected to a second doped polarity semiconductor region of each LED body, where the second doped polarity is opposite of the first doped polarity; and,
    detaching completed axial LEDs from the carrier substrate.

7. The method of claim 6 further comprising:
    prior to forming the plurality of LED bodies, depositing a work function matching layer overlying the LED wafer; and,
    depositing a current spreading layer overlying the work function matching layer.

8. The method of claim 7 wherein depositing the barrier layer over the etched insulating layer includes depositing a barrier made from a material selected from the group consisting of titanium/titanium nitride (Ti/TiN), Ti/nickel (Ti/Ni), or chromium/gold (Cr/Au).

9. The method of claim 6 further comprising:
    subsequent to bonding the LED wafer to the carrier substrate, depositing a barrier layer overlying the LEDs using a material selected from the group consisting of Ti or Cr.

10. The method of claim 6 wherein forming the insulating layer includes forming the insulating material from a material selected from the group consisting of plasma-enhanced chemical vapor deposition (PECVD) silicon dioxide ($SiO_2$), PECVD silicon nitride ($Si_3N_4$), atomic layer deposition (ALD) aluminum oxide ($Al_2O_3$), or distributed Bragg reflector (DBR).

11. The method of claim 6 wherein forming the LED bodies includes forming LED bodies each having an x-axis width; and,
    wherein forming the first and second electrode mounting wings includes forming first and second electrode mounting wings having a zy-axes plane bisecting the LED body width.

12. The method of claim 11 wherein forming the first and second electrode mounting wings includes forming first and second electrode mounting wing x-axis widths less than the LED body width, creating symmetrical LED body locking teeth extending beyond the x-axis widths of the first and second electrode mounting wings.

13. The method of claim 11 wherein forming the first electrode mounting wings includes forming the first electrode mounting wings with a z-axis first extension; and,
wherein forming the second electrode mounting wings includes forming the second electrode mounting wings with a z-axis second extension, less than or equal to the first extension.

14. The method of claim 11 wherein forming the first electrode mounting wings includes forming the first electrode mounting wings with a y-axis first length; and,
wherein forming the second electrode mounting wings includes forming the second electrode mounting wings with a y-axis second length, less than or equal to the first length.

15. The method of claim 6 wherein providing the LED wafer includes providing a gallium nitride (GaN) LED wafer comprising:
an n-doped GaN (n-GaN) semiconductor layer;
a multiple quantum well (MQW) layer overlying the n-GaN layer; and,
a p-doped GaN (p-GaN) layer overlying the MQW layer.

16. The method of claim 6 wherein providing the LED wafer includes providing an aluminum gallium indium phosphide (AlGaInP) LED wafer comprising:
an n-doped GaInP (n-GaInP) semiconductor layer;
a MQW layer overlying the n-GaInP layer; and, a p-doped AlGaInP (p-AlGaInP) layer overlying the MQW layer.

17. A fluidic assembly emissive display panel comprising:
a support substrate with a top surface and a light emitting diode (LED) cross-point control matrix comprising an array of column and row conductive lines;
an insulating layer with a zy-axes planar top surface overlying the support substrate top surface;
a plurality of wells formed in the insulating layer exposing LED interfaces in the support substrate top surface;
wherein each LED interface comprises:
a planar first interconnect platform having an x-axis first depth with respect to the insulating layer top surface and connected to a corresponding column line, configured to accept an axial LED first electrode mounting wing;
a planar second interconnect platform having the first depth and connected to a corresponding row line, configured to accept an axial LED second electrode mounting wing; and,
a groove interposed between the first and second interconnect platforms and having an x-axis second depth, greater than the first depth, configured to accept an axial LED body locking tooth.

18. The display panel of claim 17 wherein the first and second interconnect platforms have a rectangular shape; and,
wherein the groove has a rectangular shape.

19. The display panel of claim 18 wherein each LED interface is bisected by a center y-axis;
wherein the first interconnect platform has a z-axis first extension and a y-axis first length;
wherein the second interconnect platform has a z-axis second extension, less than the first extension, and a y-axis first length; and,
wherein the groove has a z-axis third extension, offset from the center y-axis, and a y-axis first length.

20. The display panel of claim 19 wherein the wells have a shape selected from a group consisting of circular, partially covering the first and second interconnect rectangular shapes, or rectangular, exposing the first and second interconnect rectangular shapes.

21. The display panel of claim 18 wherein each LED interface is bisected by a center z-axis;
wherein the first interconnect platform has a y-axis first length bisected by the center z-axis; and,
wherein the second interconnect platform has a y-axis second length bisected by the center z-axis, less than the first length.

22. The display panel of claim 17 further comprising:
an axial LED occupying each well, each axial LED comprising:
an inorganic LED body with two symmetrical locking teeth, with one of the locking teeth lodged in the LED interface groove;
a first electrode mounting wing electrically connected between a first doped polarity semiconductor layer of the LED body and the LED interface first interconnect platform, and aligned in a plane orthogonal to stacked LED body semiconductor layers; and,
a second electrode mounting wing electrically connected between a second doped polarity semiconductor layer of the LED body, opposite in polarity to the first doped polarity, and the LED interface second interconnect platform, and aligned orthogonal to the stacked semiconductor layers.

23. The display panel of claim 22 wherein the LED body has an x-axis width orthogonal to the stacked semiconductor layers; and,
wherein the first and second electrode mounting wings bisect the LED body width.

24. The display panel of claim 23 wherein the first and second electrode mounting wings have x-axis widths less than the LED body width, forming the symmetrical LED body locking teeth extending beyond the x-axis widths of the first and second electrode mounting wings.

25. The display panel of claim 24 wherein the first electrode mounting wing has a z-axis first extension and the second electrode mounting wing has a z-axis second extension, less than or equal to the first extension.

26. The display panel of claim 24 wherein the first electrode mounting wing has a y-axis first length and the second electrode mounting wing has a y-axis second length, less than or equal to the first length.

27. The display panel of claim 22 wherein the LED is a gallium nitride (GaN) LED and the LED body comprises:
an n-doped GaN (n-GaN) semiconductor layer;
a multiple quantum well (MQW) layer overlying the n-GaN layer; and,
a p-doped GaN (p-GaN) layer overlying the MQW layer.

28. The display panel of claim 22 wherein the LED is an aluminum gallium indium phosphide (AlGaInP) LED and the LED body comprises:
an n-doped GaInP (n-GaInP) semiconductor layer;
a MQW layer overlying the n-GaInP layer; and,
a p-doped AlGaInP (p-AlGaInP) layer overlying the MQW layer.

29. The display panel of claim 22 further comprising:
a distributed Bragg reflector (DBR) coating formed on the LED body locking tooth lodged in the LED interface groove.

30. The display panel of claim 22 further comprising a plurality of pixel groups, each pixel group including n number of LED interfaces;
wherein LED interfaces in each pixel group are mutually distinguished by a characteristic selected from the group consisting of well shape, first interconnect platform shape, second interconnect platform shape, groove shape, or combinations thereof; and,
wherein the LEDs are n types of LEDs mutually distinguished by a characteristic selected from the group consisting of LED body height, LED body length, electrode wing extension, electrode wing length, or combinations thereof.

31. A method for the fluidic assembly of emissive display panels, the method comprising:
providing a panel with a plurality of wells exposing light emitting diode (LED) interfaces, with each LED interface comprising:
a planar first interconnect platform having an x-axis first depth;
a planar second interconnect platform having the x-axis first depth;
a groove interposed between the first and second interconnect platforms and having an x-axis second depth, greater than the first depth;
providing axial LEDs, each axial LED comprising:
an inorganic LED body with two symmetrical locking teeth;
a first electrode mounting wing aligned in a plane orthogonal to stacked LED body semiconductor layers; and,
a second electrode mounting wing aligned in the plane orthogonal to the stacked semiconductor layers;
adding the LEDs to a liquid to create a suspension of LEDs;
flowing the suspension across the panel;
capturing LEDs within the wells; and,
lodging LED locking teeth in corresponding LED interface grooves.

32. The method of claim 31 wherein providing the panel includes providing a panel with solder-coated LED interface interconnect platforms; and,
the method further comprising:
annealing the panel to electrically connect the LED electrode wings to the LED interface interconnect platforms.

33. The method of claim 31 wherein providing the panel includes providing a panel with a plurality of pixel groups, each pixel group including n number of LED interface surfaces, where the LED interfaces in each pixel group are mutually distinguished by a characteristic selected from the group consisting of well shape, first interconnect platform shape, second interconnect platform shape, groove shape, or combinations thereof;
wherein providing the LEDs includes providing n types of LEDs mutually distinguished by a characteristic selected from the group consisting of LED body height, LED body length, electrode wing extension, electrode wing length, or combinations thereof; and,
wherein flowing the suspension includes flowing a suspension including a combination of all n types of LEDs or sequentially flowing n suspensions with the corresponding different types of LEDs.

34. The method of claim 31 wherein providing the LEDs includes providing LEDs with a distributed Bragg reflector (DBR) coating; and,
the method further comprising:
subsequent to lodging LED locking teeth in corresponding LED interface grooves, anisotropically etching the LEDs to remove exposed DBR.

35. The method of claim 31 wherein providing the panel includes providing a panel with circular wells;
wherein capturing the LEDs within the wells includes capturing randomly aligned LEDs within the diameter of the wells;
the method further comprising:
rotating captured LEDs within the wells in response to the suspension flow; and,
wherein lodging LED teeth in corresponding LED interface grooves includes lodging the LED in response to rotating the captured LEDs.

36. An axial light emitting diode (LED) comprising:
an inorganic LED three-dimensional body comprising stacked semiconductor horizontal layers in parallel xy-axes planes with an x-axis width;
a first electrode mounting wing connected to a first doped polarity semiconductor layer of the LED body and aligned in a zy-axes plane orthogonal to the xy-axes planes, bisecting the LED body width, with a y-axis first length;
a second electrode mounting wing connected to a second doped polarity semiconductor layer of the LED body, opposite in polarity to the first doped polarity, and aligned in the same zy-axes plane as the first electrode mounting wing, bisecting the LED body width, with a y-axis second length less than or equal to the first length; and,
wherein the first and second electrode mounting wings have x- axis widths less than the LED body width, forming symmetrical LED body locking teeth extending beyond the x-axis widths of the first and second electrode mounting wings.

37. The axial LED of claim 36 wherein the first electrode mounting wing has a z-axis first extension and the second electrode mounting wing has a z-axis second extension, less than or equal to the first extension.

38. The axial LED of claim 36 wherein the LED is a gallium nitride (GaN) LED and the LED body comprises:
an n-doped GaN (n-GaN) semiconductor layer;
a multiple quantum well (MQW) layer overlying the n-GaN layer; and,
a p-doped GaN (p-GaN) layer overlying the MQW layer.

39. The axial LED of claim 36 wherein the LED is an aluminum gallium indium phosphide (AlGaInP) LED and the LED body comprises:
an n-doped GaInP (n-GaInP) semiconductor layer;
a MQW layer overlying the n-GaInP layer; and,
a p-doped AlGaInP (p-AlGaInP) layer overlying the MQW layer.

40. The axial LED of claim 36 further comprising:
a distributed Bragg reflector (DBR) coating overlying the LED body.

* * * * *